United States Patent
Machida et al.

(10) Patent No.: US 8,093,894 B2
(45) Date of Patent: Jan. 10, 2012

(54) MAGNETIC RESONANCE IMAGING APPARATUS AND MAGNETIC RESONANCE IMAGING METHOD FOR IMPROVING UNIFORMITY IN SENSITIVITY MAP

(75) Inventors: Yoshio Machida, Nasushiobara (JP); Nobuyasu Ichinose, Otawara (JP)

(73) Assignees: Kabushiki Kaisha Toshiba, Tokyo (JP); Toshiba Medical Systems Corporation, Tochigi-Ken (JP)

(*) Notice: Subject to any disclaimer, the term of this patent is extended or adjusted under 35 U.S.C. 154(b) by 178 days.

(21) Appl. No.: 12/396,693

(22) Filed: Mar. 3, 2009

(65) Prior Publication Data

US 2009/0224756 A1 Sep. 10, 2009

(30) Foreign Application Priority Data

Mar. 5, 2008 (JP) .................................. 2008-055295

(51) Int. Cl.
*G01V 3/00* (2006.01)
(52) U.S. Cl. ...................................................... 324/307
(58) Field of Classification Search ........... 324/300–322
See application file for complete search history.

(56) References Cited

U.S. PATENT DOCUMENTS

| | | | |
|---|---|---|---|
| 5,910,728 A * | 6/1999 | Sodickson | 324/309 |
| 6,771,067 B2 * | 8/2004 | Kellman et al. | 324/307 |
| 7,187,791 B2 | 3/2007 | Ikezaki | |
| 7,202,663 B2 * | 4/2007 | Huang | 324/307 |
| 7,227,359 B2 * | 6/2007 | Ma | 324/309 |
| 7,288,937 B2 * | 10/2007 | Nabetani | 324/309 |
| 7,385,397 B2 * | 6/2008 | Uchizono et al. | 324/318 |
| 7,397,242 B2 * | 7/2008 | Samsonov et al. | 324/309 |
| 7,746,070 B2 * | 6/2010 | Park et al. | 324/309 |
| 7,800,368 B2 * | 9/2010 | Vaughan et al. | 324/318 |

FOREIGN PATENT DOCUMENTS

JP   11-056811 A   3/1999

* cited by examiner

*Primary Examiner* — Dixomara Vargas
(74) *Attorney, Agent, or Firm* — Knoble Yoshida & Dunleavy, LLC

(57) ABSTRACT

A magnetic resonance imaging apparatus includes a sensitivity map data generating unit and a sensitivity corrected image data generating unit. The sensitivity map data generating unit generates reference image data based on data for generating sensitivity map data of a phased array coil and generates the sensitivity map data by using reference image data after correction processing obtained by applying the correction processing to improve a uniformity with the reference image data based on the reference image data and phased array coil data for generating the sensitivity map data. The sensitivity corrected image data generating unit acquires image data for imaging with the phased array coil and performs sensitivity correction of the image data using the sensitivity map data.

7 Claims, 26 Drawing Sheets

SENSITIVITY CORRECTED IMAGE DATA

PAC IMAGE DATA FOR SENSITIVITY MAP DATA

WBC IMAGE DATA FOR SENSITIVITY MAP DATA

MAGNETIC RESONANCE IMAGING APPARATUS AND MAGNETIC RESONANCE IMAGING METHOD FOR IMPROVING UNIFORMITY IN SENSITIVITY MAP

BACKGROUND OF THE INVENTION

1. Field of the Invention

The present invention relates to a MRI (magnetic resonance imaging) apparatus and a magnetic resonance imaging method which excite nuclear spin of an object magnetically with a RF (radio frequency) signal having the Larmor frequency and reconstruct an image based on NMR (nuclear magnetic resonance) signals generated due to the excitation, and more particularly, to a magnetic resonance imaging apparatus and a magnetic resonance imaging method which make it possible to correct nonuniformity in signal intensities, of image data acquired by imaging with using plural receive coils, occurring due to sensitivity distribution of each receive coil.

2. Description of the Related Art

Magnetic Resonance Imaging is an imaging method which excites nuclear spin of an object set in a static magnetic field with a RF signal having the Larmor frequency magnetically and reconstruct an image based on MR (magnetic resonance) signals generated due to the excitation.

As one of the conventional high-speed imaging technique in the field of magnetic resonance imaging, the technique to receive data by using the PAC (phased array coil) having multiple surface coils as receive coils is used. However, the spatial sensitivity nonuniformity of each surface coil used as a receive coil increases in using the PAC and it is imperative to perform the spatial sensitivity correction of a receive coil on data.

The conventional sensitivity corrections of a receive coil on image data include the method to use WBC image data that is acquired by using the WBC (whole body coil) as a receive coil (see, for example, Japanese Patent Application (Laid-Open disclosure) No. 2005-237702). The MRI apparatus includes normally the WBC for reception and transmission and a receive coil. Some kind or another reference image data is required to correct the influence of the sensitivity nonuniformity of a receive coil. Accordingly, image data acquired by the WBC has been generally used as reference image data for sensitivity correction conventionally.

FIG. 1 is a flowchart showing a procedure of the conventional sensitivity correction processing with using a WBC as a receive coil. The symbols each including S with a number in FIG. 1 indicate respective steps of the flowchart.

As shown in FIG. 1, the sensitivity map pre-scan for acquiring sensitivity map data indicating the sensitivity distribution of a receive coil is performed as a pre-scan in the step S1 prior to the main scan that is an imaging scan for acquiring image data. In the sensitivity map pre-scan, data is acquired under a same imaging condition by using the PAC and the WBC as a receive coil alternatively. Then, PAC image data and WBC image data are respectively generated by the image reconstruction processing of pieces data acquired by respectively using the PAC and the WBC.

WBC image data is acquired as image data corresponding to a large area enough for the FOV (field of view) of the object. Therefore, when coupling of the WBC is adequately reduced, characteristic of the WBC becomes nearly uniform. Consequently, WBC image data becomes reasonably uniform image data and can be used as reference image data. Meanwhile, PAC image data becomes nonuniform image data by the influence of nonuniform sensitivity distribution of the PAC. Therefore, the sensitivity distribution of the PAC can be estimated by dividing PAC image data by WBC image data.

For that purpose, basic data for estimating sensitivity map data of the PAC is generated by dividing PAC image data by WBC image data in the step S2. At this time, a part of data having subthreshold signal intensity is masked by the threshold processing on PAC image data and WBC image data.

Then in the step S3, sensitivity map data of the PAC in a required spatial region is generated from the basic data. Specifically, pieces of data in regions where the division result can not be calculated are interpolated by interpolation and extrapolation.

Then in the step S4, data is acquired by the imaging scan for acquiring image data and image data is generated by the image reconstruction processing of the acquired data. Then, the sensitivity correction processing is performed on the image data by using the sensitivity map data of the PAC. That is, absolute values of the signal intensities of the image data are corrected based on the sensitivity map data. This allows nonuniformity of the image data to be corrected.

The technique to estimate sensitivity map data only from PAC image data has been devised as another sensitivity correction technique (see, for example, Japanese Patent Application (Laid-Open disclosure) No. 2005-237703). This technique easily estimates sensitivity map data having a rough accuracy by performing processing such as threshold processing, region reduction processing, interpolation processing, extrapolation processing and smoothing on PAC image data having a low contrast.

However, the conventional sensitivity correction technique with using the WBC might not correct nonuniformity of image data acquired by an imaging scan adequately.

FIG. 2 is a diagram showing an image of which nonuniformity due to sensitivity unevenness does not corrected adequately in spite of the conventional sensitivity correction with using the WBC. FIG. 3 is a diagram showing a profile of pixel values on respective pixel positions on a ROI (region of interest) which is represented with a line in an image, corrected under the conventional sensitivity correction method, shown in FIG. 2.

FIG. 2 shows a longitudinal relaxation (T1) weighted image of the head acquired by the conventional sensitivity correction by using WBC image data. Approximately 20% of sensitivity irregularity occurs on either side of the brain in the example shown in FIG. 2. For example, the pixel values of the part on the right side is reduced by approximately 20% by correction.

This insufficient sensitivity correction is due to nonuniformity of WBC image data acquired by the sensitivity map pre-scan. Nonuniformity of WBC image data is attributed in part to inter-coil coupling between the WBC and the PAC. That is, due to causes such as inter-coil coupling between the WBC and the PAC, sensitivity irregularity might be generated on reference WBC image data itself and also on estimated sensitivity map data. Sensitivity irregularity remains on image data after sensitivity correction when the sensitivity correction is performed by using sensitivity map data having sensitivity irregularity.

FIG. 4 shows conventional PAC image data acquired for generating sensitivity map data. FIG. 5 is a diagram showing a profile of pixel values on respective pixel positions on a linear ROI in the conventional PAC image data for generating sensitivity map data shown in FIG. 4. FIG. 6 shows conventional WBC image data acquired for generating sensitivity map data. FIG. 7 is a diagram showing a profile of pixel values on respective pixel positions on a linear ROI in the conventional WBC image data for generating sensitivity map data shown in FIG. 6.

FIG. 4 and FIG. 6 show examples of typical PAC image data and WBC image data acquired for estimating sensitivity map data of the PAC, respectively. As shown in FIG. 4 and FIG. 5, PAC image data acquired by the sensitivity map pre-scan has nonuniformity according to the characteristic of the PAC that is a receive coil. Basically, sensitivity map data is estimated based on data derived by dividing the PAC image data by the WBC image data (the PAC image data/the WBC image data). Therefore, it is important that the WBC image data becomes flat to some extent without sensitivity irregularity.

However, as shown in FIG. 6 and FIG. 7, WBC image data might not become adequately uniform. In the example of WBC image data shown in FIG. 6 and FIG. 7, a difference in the pixel value between the right and left sides is found. When sensitivity map data for sensitivity correction is calculated by using such nonuniform WBC image data as reference image data, a correction of a T1 weighted image that is a target of the sensitivity correction becomes actually insufficient.

Moreover, in a case where uniformity of the sensitivity distribution is low due to a dielectric artifact in a MRI apparatus that generates a high magnetic field, in a case where the sensitivity distribution of the PAC is nonuniform and under various conditions, adequate sensitivity correction might be difficult.

SUMMARY OF THE INVENTION

The present invention has been made in light of the conventional situations, and it is an object of the present invention to provide a magnetic resonance imaging apparatus and a magnetic resonance imaging method which make it possible to perform sensitivity correction of respective receive coils to image data acquired by imaging with using the receive coils more satisfactorily by improving uniformity of reference image data used for the sensitivity correction.

The present invention provides a magnetic resonance imaging apparatus comprising: a sensitivity map data generating unit configured to generate reference image data based on data for generating sensitivity map data of a phased array coil and generate the sensitivity map data by using reference image data after correction processing obtained by applying the correction processing to improve a uniformity with the reference image data based on the reference image data and phased array coil data for generating the sensitivity map data, the data being acquired from an object, the phased array coil data being acquired with the phased array coil as a receive coil; and a sensitivity corrected image data generating unit configured to acquire image data for imaging from the object with the phased array coil as a receive coil and generate image data after sensitivity correction by performing the sensitivity correction of the image data using the sensitivity map data, in an aspect to achieve the object.

The present invention also provides a magnetic resonance imaging method comprising: generating reference image data based on data for generating sensitivity map data of a phased array coil and generating the sensitivity map data by using reference image data after correction processing obtained by applying the correction processing to improve a uniformity with the reference image data based on the reference image data and phased array coil data for generating the sensitivity map data, the data being acquired from an object, the phased array coil data being acquired with the phased array coil as a receive coil; and acquiring image data for imaging from the object with the phased array coil as a receive coil and generating image data after sensitivity correction by performing the sensitivity correction of the image data using the sensitivity map data, in an aspect to achieve the object.

The magnetic resonance imaging apparatus and the magnetic resonance imaging method according to the present invention as described above make it possible to perform sensitivity correction of respective receive coils to image data acquired by imaging with using the receive coils more satisfactorily by improving uniformity of reference image data used for the sensitivity correction.

DESCRIPTION OF THE PREFERRED EMBODIMENTS

A magnetic resonance imaging apparatus and a magnetic resonance imaging method according to embodiments of the present invention will be described with reference to the accompanying drawings.
(Configuration and Function)

Figure 8:
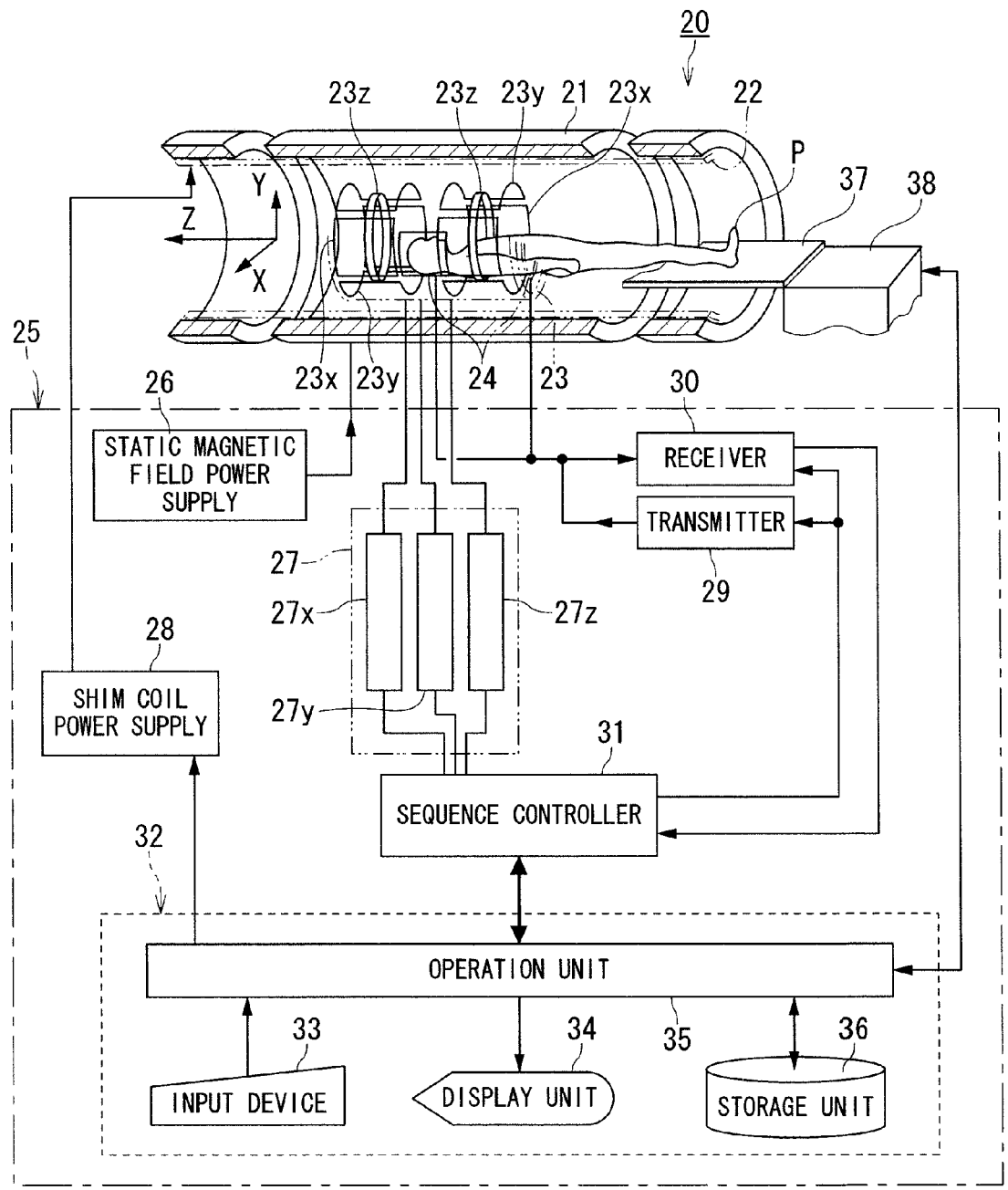
FIG. 8 is a block diagram showing a magnetic resonance imaging apparatus according to an embodiment of the present invention.

FIG. 8 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and RF coils 24.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, a operation unit 35 and a storage unit 36.

The static field magnet 21 communicates with the static magnetic field power supply 26. The static magnetic field power supply 26 supplies electric current to the static field magnet 21 to get the function to generate a static magnetic field in a imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. The RF coils 24 include a whole body coil (WBC), which is built in the gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 has a function to transmit a RF signal given from the transmitter 29 to the object P. The reception RF coil 24 has a function to receive a MR signal generated due to an nuclear spin inside the object P which is excited by the RF signal to give to the receiver 30.

Figure 9:
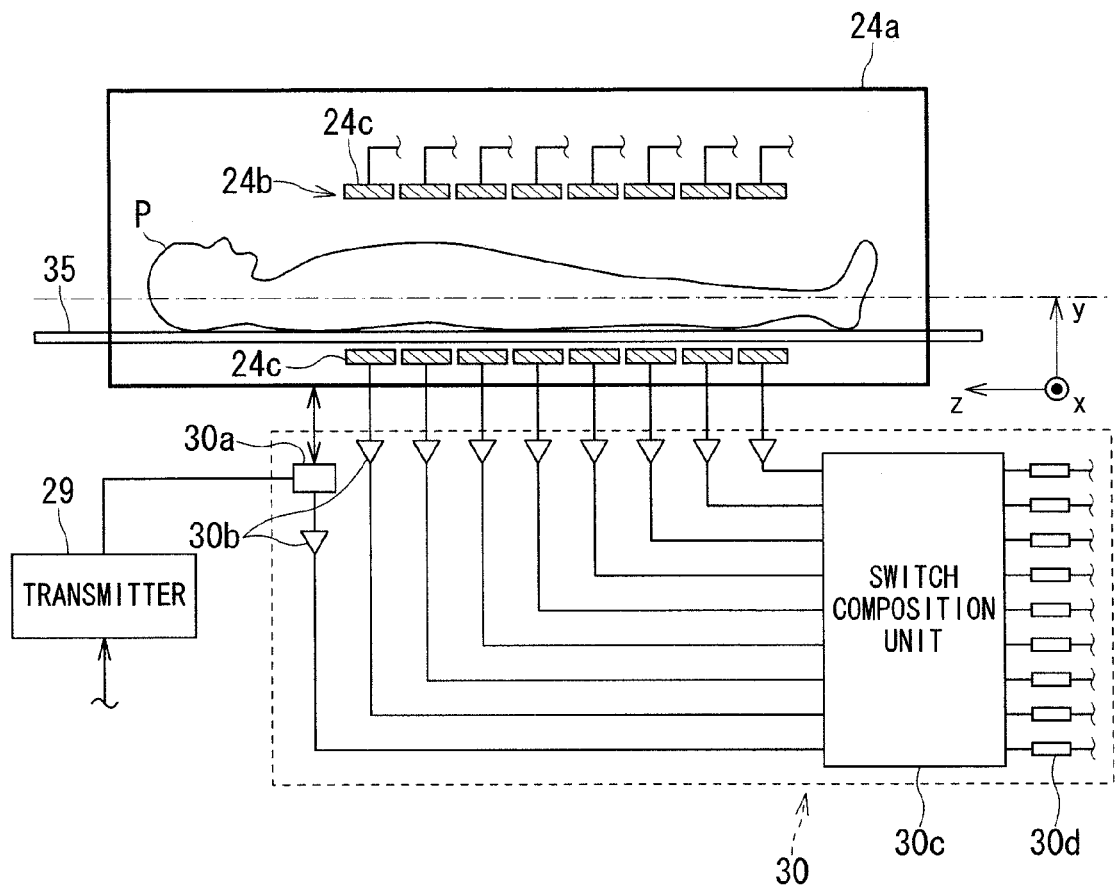
FIG. 9 is a diagram showing an example of detail structures of the RF coils shown in FIG. 8.
Figure 10:
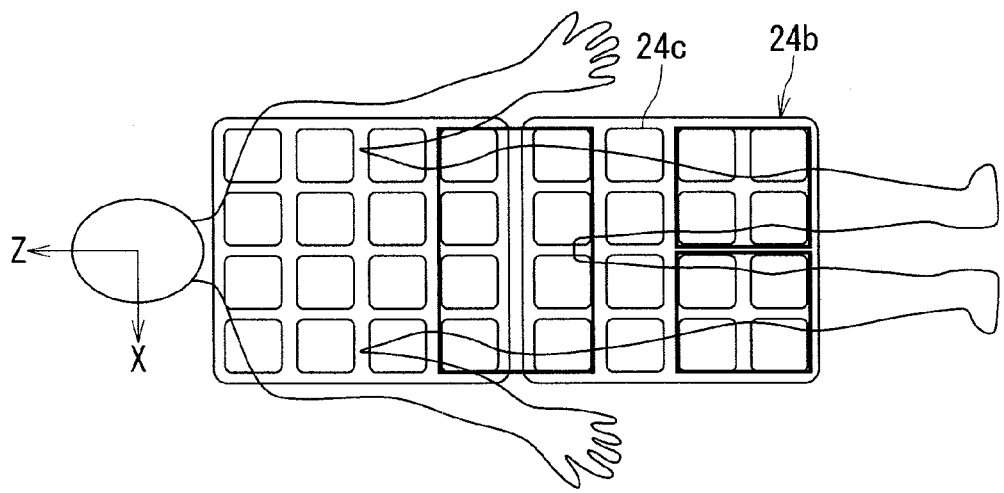
FIG. 10 is a diagram showing an example arrangement of the coil elements set on the body surface side of the object P shown in FIG. 9.
Figure 11:
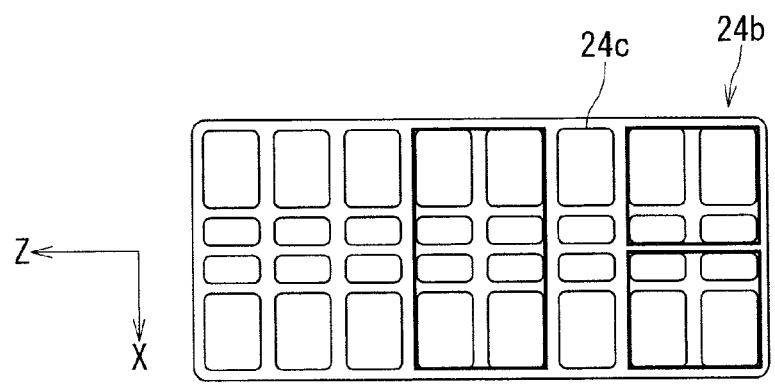
FIG. 11 is a diagram showing an example arrangement of the coil elements set on the back surface side of the object P shown in FIG. 9.

FIG. 9 is a diagram showing an example of detail structures of the RF coils 24 shown in FIG. 8. FIG. 10 is a diagram showing an example arrangement of the coil elements 24c set on the body surface side of the object P shown in FIG. 9. FIG. 11 is a diagram showing an example arrangement of the coil elements 24c set on the back surface side of the object P shown in FIG. 9.

As shown in FIG. 9, the RF coils 24 include a cylindrical whole-body coil (WBC) 24a, and a phased array coil (PAC) 24b. The phased array coil 24b includes a plurality of coil elements (surface coils) 24c, and a plurality of the coil elements 24c are arranged on each of the body surface side and the back surface side of the object P.

For example, as shown in FIG. 10, on the body surface side of the object P, four rows of coil elements 24c are provided in the x-direction and eight columns of them in the z-direction, that is, a total of thirty two coil elements 24c are arranged so as to cover a wide-ranging imaging area. Likewise, as shown in FIG. 11, on the back surface side of the object, four rows of coil elements 24c are provided in the x-direction and eight columns of them in the z-direction, that is, a total of thirty two coil elements 24c are arranged so as to cover a wide-ranging imaging area. On the back surface side, coil elements 24c with a smaller size than that of the other coil elements 24c are arranged in the vicinity of the body axis from the viewpoint of sensitivity improvement, considering for the presence of the backbone of the object P.

On the other hand, the receiver 30 includes a duplexer 30a, amplifiers 30b, a switch composition unit 30c, and reception circuits 30d. The duplexer 30a is connected to the transmitter 29, the WB coil 24a, and the amplifier 30b for the WB coil 24a. The amplifiers 30b are provided by the total number of the coil elements 24c and the WB coil 24a, and each connected to a respective one of the coil elements 24c and the WB coil 24a. The switch composition unit 30c consists of a single piece or a plurality of pieces. The input side of the switch composition unit 30c is connected to the plurality of coil elements 24c or the WB coil 24a through the plurality of amplifiers 30b. The reception circuits 30d are provided by a desired number such as to be smaller than or equal to the total number of the coil elements 24c and the WB coil 24a, and disposed on the output side of the switch composition unit 30c.

The WB coil 24a can be used as a coil for the transmission of RF signals. As a coil for the reception of NMR signals, each of the coil elements 24c can be used. Furthermore, the WB coil 24a can also be used for a receiving coil.

Therefore, the duplexer 30a is configured so as to provide the WB coil 24a with radio frequency signals for transmission, outputted from the transmitter 29, while providing the switch composition unit 30c with NMR signals received in the WB coil 24a via the amplifiers 30b in the receiver 30. An NMR signal received in each of the coil elements 24c is outputted to the switch composition unit 30c via a respective one of the amplifiers 30b.

The switch composition unit 30c is configured so as to perform composition processing and switching with respect to NMR signals received from the coil elements 24c or the WB coil 24a and to output them to the corresponding reception circuits 30d. In other words, the switch composition unit 30c is configured so that, in conformance with the number of the reception circuits 30d, the composition processing and switching with respect to NMR signals received from the coil elements 24c or the WB coil 24a are performed in the switch composition unit 30c, and that NMR signals can be received from various imaging areas by forming sensitivity distributions in response to the imaging areas, using a plurality of desired coil elements 24c.

However, NMR signals may be received by WB coil 24a alone without providing the coil elements 24c. Also, NMR signals received in the coil elements 24c or the WB coil 24a may be directly outputted to the reception circuits 30d without providing the switch composition unit 30c. Furthermore, more coil elements 24c may be extensively arranged.

Figure 12:
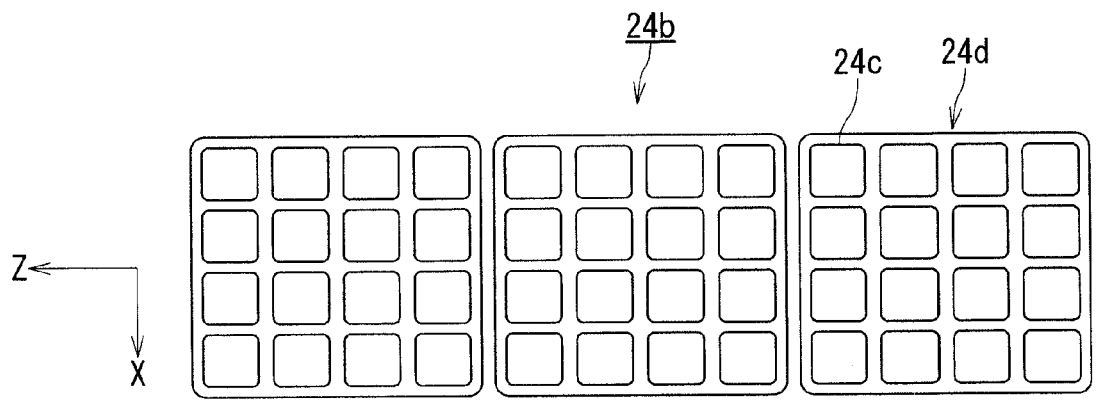
FIG. 12 is a diagram showing another example arrangement of the coil elements set on the body surface side of the object shown in FIG. 9.
Figure 13:
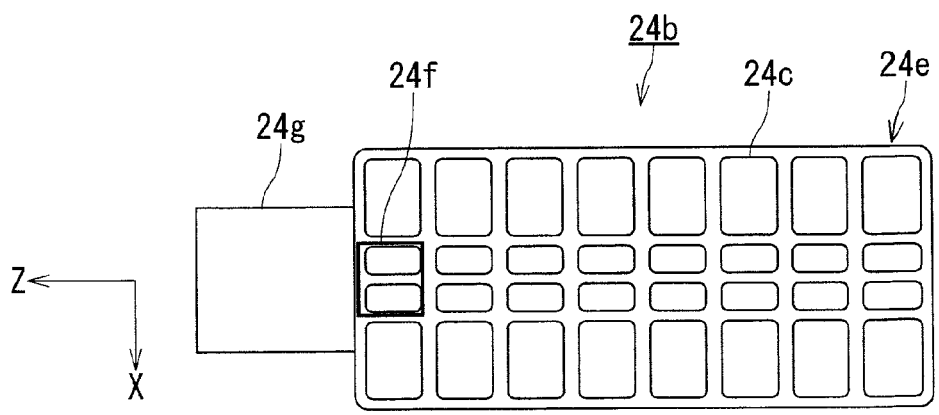
FIG. 13 is a diagram showing another example arrangement of the coil elements set on the back surface side of the object shown in FIG. 9.

FIG. 12 is a diagram showing another example arrangement of the coil elements 24c set on the body surface side of the object P shown in FIG. 9. FIG. 13 is a diagram showing another example arrangement of the coil elements 24c set on the back surface side of the object P shown in FIG. 9.

As shown in FIGS. 12 and 13, further more coil elements 24c may be arranged around the object P. In an example shown in FIG. 12, three coil units 24d each composed of sixteen elements constituted of four columns of coil elements 24c in the x-direction and four rows of coil elements 24c in the z-direction are arranged in the z-direction, that is, a total of forty eight elements of coil elements 24c are arranged on the body surface side of the object P. On the other hand, in an example shown in FIG. 13, a coil unit 24e composed of thirty two elements constituted of four columns of coil elements 24c in the x-direction and eight rows of coil elements 24c in the z-direction are arranged on the backbone side of the object P; a coil units 24f having coil elements 24c composed of two elements (not shown) are arranged in the vicinity of jaws; and further a coil unit 24g having coil elements 24c composed of twelve elements (not shown) are arranged under the head, that is, a total of forty six elements of coil elements 24c are arranged on the back surface side of the object P. Arranging the coil elements 24c on the body surface side and back surface side of the object P as shown in FIGS. 12 and 13 results in that a total of ninety four elements of coil elements 24c are arranged around the object P. Each of the coil elements 24c is connected to a respective exclusive one of the amplifiers 30b via a coil port (not shown).

Arranging a multitude of coil elements 24c around the object P makes it possible to form a phased array coil 24b for the whole-body, capable of receiving data from a plurality of imaging areas without moving the positions of the coils or that of the object P. Although the WB coil 24a can also receive data from a plurality of imaging areas without moving the positions of the coils or that of the object P, the use of the phased array coil 24b as a receiving coil allows data to be received with sensitivities more suitable for the imaging areas and with a better signal-to-noise ratio (SNR).

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27

The sequence controller 31 is also configured to give raw data to the computer 32. The raw data is complex data obtained through the detection of a NMR signal and A/D (analog to digital) conversion to the NMR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a NMR signal given from the RF coil 24 and performing predetermined signal processing and A/D converting to the NMR signal detected. The receiver 30 also has a function to give the generated raw data to the sequence controller 31.

The computer 32 gets various functions by the operation unit 35 executing some programs stored in the storage unit 36 of the computer 32. Alternatively, some specific circuits having various functions may be provided with the magnetic resonance imaging apparatus 20 instead of using some of the programs.

Figure 14:
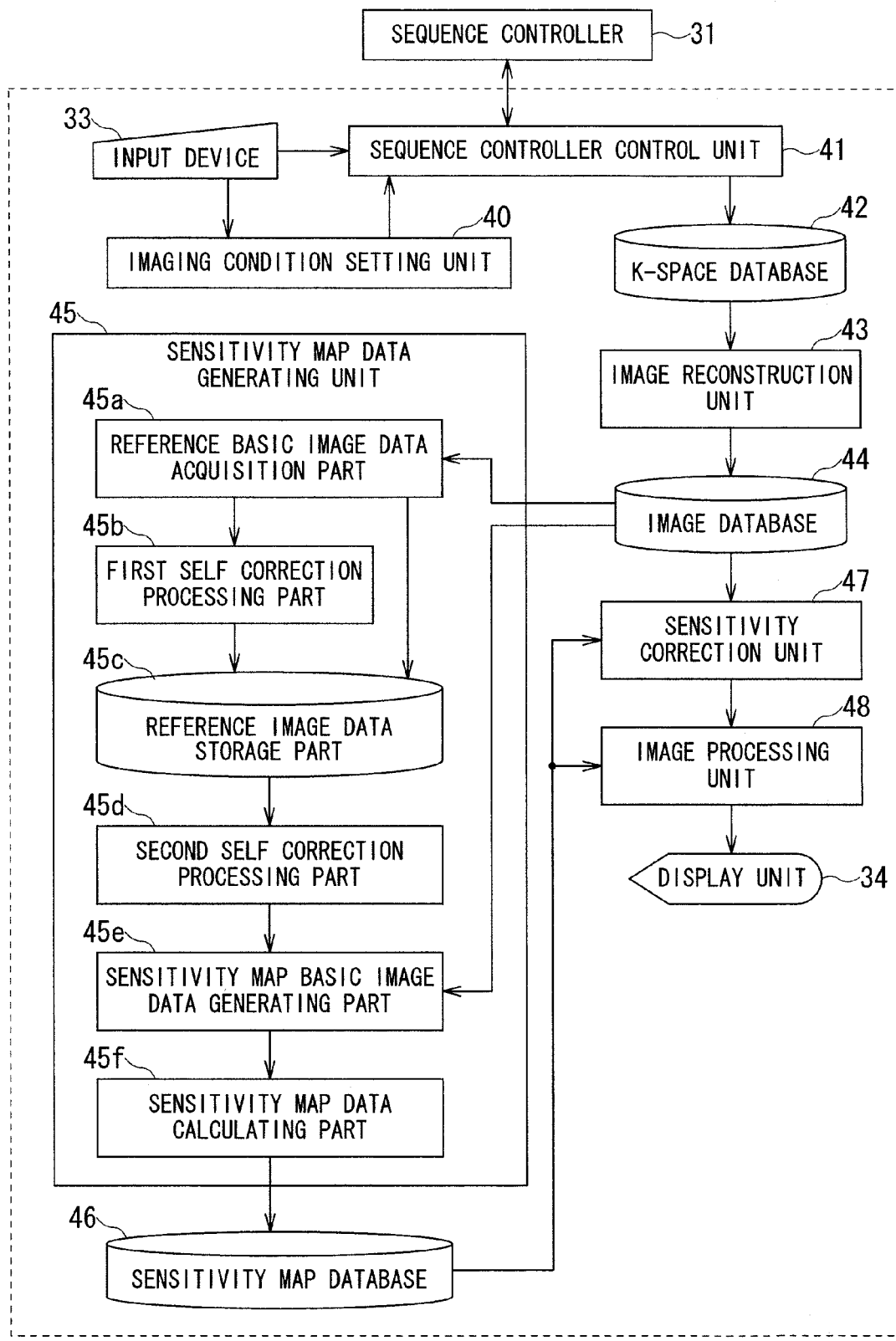
FIG. 14 is a functional block diagram of the computer shown in FIG. 8.

FIG. 14 is a functional block diagram of the computer 32 shown in FIG. 8.

The computer 32 functions as an imaging condition setting unit 40, a sequence controller control unit 41, a k-space database 42, an image reconstruction unit 43, an image database 44, a sensitivity map data generating unit 45, a sensitivity map database 46, a sensitivity correction unit 47 and an image processing unit 48 by program. The sensitivity map data generating unit 45 includes a reference basic image data acquisition part 45a, a first self correction processing part 45b, a reference image data storage part 45c, a second self correction processing part 45d, a sensitivity map basic image data generating part 45e and a sensitivity map data calculating part 45f.

The imaging condition setting unit 40 has functions to set imaging conditions including a pulse sequence for performing an imaging scan for acquiring image data based on instruction information from the input device 33, and to provide the set imaging conditions to the sequence controller control unit 41. For example, the imaging condition setting unit 40 can set the WB coil 24a or the phased array coil 24b to a receive coil. In addition, the imaging condition setting unit 40 can also set an imaging condition for performing PI (parallel imaging) by using plural coil elements 24c included in the phased array coil 24b as receive coils.

PI is an imaging method for reducing the number of the phase encodes necessary for image reconstruction by receiving echo data with plural coil elements 24c and skipping phase encodes. In principle, the number of the phase encodes can be reduced down to the number derived by dividing the number of the phase encodes necessary for image reconstruction by the number of coil elements 24c. When PI is performed, information including the number of coil element 24c for acquiring echo data and information associating each coil element 24c with an imaging part necessary for PI is set as an imaging condition.

Moreover, the imaging condition setting unit 40 can set an imaging condition for performing not only an imaging scan but also a sensitivity map pre-scan for acquiring data for generating sensitivity map data, necessary with PI, of the coil elements 24c.

The sequence controller control unit 41 has a function for controlling the driving of the sequence controller 31 by giving an imaging condition including a pulse sequence and coil information indicating coils selected as receive coils to the sequence controller 31 based on information from the input device 33 or another element. In addition, the sequence controller control unit 41 has a function for receiving raw data from the sequence controller 31 and arranging the raw data to k space formed in the k-space database 42. Therefore, the k-space database 42 stores the raw data generated by the receiver 30 as k space data. That is, k-space data is arranged in the k-space formed in the k-space database 42.

The image reconstruction unit 43 has a function for reconstructing image data which is real space data from k-space data by capturing the k-space data from the k-space database 42 and performing image reconstruction processing including FT (Fourier transform) processing to the k-space data, and writing the generated image data to the image database 44. Therefore, the image database 44 stores the image data reconstructed by the image reconstruction unit 43.

The sensitivity map data generating unit 45 has functions to read image data, acquired by performing a sensitivity map pre-scan, for generating sensitivity map data from the image database 44 and generating sensitivity map data indicating spatial sensitivity distributions of respective coil element 24c, and to write the generated sensitivity map data into the sensitivity map database 46.

Consequently, sensitivity map data of the respective coil elements 24c generated by the sensitivity map data generating unit 45 is stored in the sensitivity map database 46.

The sensitivity correction unit 47 has functions to read image data acquired by performing an imaging scan from the image database 44 and performing sensitivity correction processing of the read image data with using the sensitivity map data read from the sensitivity map database 46, and to provide the image data after sensitivity correction processing to the image processing unit 48.

The image processing unit 48 has functions to generate image data for display by performing necessary imaging processing of the image data after sensitivity correction processing acquired from the sensitivity correction unit 47 and to display the generated image data for display on the display unit 34. Especially, when echo data is acquired by PI, unfolding processing of image data corresponding to each coil element 24c is performed in the image processing unit 48. The unfolding processing is post-processing performed based on conditions of PI, and unfolded image data is generated by the unfolding processing. Sensitivity map data of each coil element 24c is used in the unfolding processing.

Hereinafter, the detailed function of the sensitivity map data generating unit 45 will be described.

The reference basic image data acquisition part 45a has functions to acquire reference basic image data that is image data, for generating sensitivity map data, acquired by performing a sensitivity map pre-scan from the image database 44 and to provide the acquired reference basic image data to the first self correction processing part 45b or the reference image data storage part 45c.

Reference basic image data includes WBC image data acquired by setting the WB coil 24a as a receive coil and PAC image data acquired by setting the phased array coil 24b as a receive coil in a sensitivity map pre-scan. Generally, SOS ((square root of) sum of squares) image data is generated as PAC image data but sometimes complex addition image data is generated.

For example, the reference basic image data acquisition part 45a is configured to write reference basic image data acquired from the image database 44 into the reference image data storage part 45c as reference image data when the reference basic image data is not nonuniform or uniform to some extent. On the other hands, the reference basic image data acquisition part 45a is configured to provide the reference basic image data to the first self correction processing part 45b when the reference basic image data is nonuniform. In most cases, PAC image data and WBC image data acquired under a high magnetic field are nonuniform. For this reason, it is preferable to perform the first self correction processing as preprocessing for making PAC image data and WBC image data acquired under a high magnetic field into reference image data in the first self correction processing part 45b. Therefore, it is preferable that PAC image data and WBC image data acquired under a high magnetic field are provided to the first self correction processing part 45b. In contrast, WBC image data acquired under a low magnetic field is not nonuniform in most cases. For this reason, WBC image data acquired under a low magnetic field can be written into the reference image data storage part 45c as reference image data as it is from the viewpoint of process simplification and shortening of processing time.

The first self correction processing part 45b has functions to perform rough correction processing of reference basic image data acquired from the reference basic image data acquisition part 45a by performing the first self correction processing of the reference basic image data, and to write the reference basic image data after the rough correction processing into the reference image data storage part 45c as reference image data. The first self correction processing improves nonuniformity of target data to be corrected based on the target data itself without using other data. This rough correction processing can generate reference image data uniform to some extent from nonuniform reference basic image data. An example of the first self correction processing is correction processing by which processing target data is extracted by threshold processing and/or region reduction processing, rough sensitivity map data is calculated by interpolating data again through interpolation processing and/or extrapolation processing of the extracted processing target data and smoothing processing with a spatial low-pass filter and then the original data is divided by the rough sensitivity map data.

The reference image data storage part 45c has a function to store reference image data written from the reference basic image data acquisition part 45a and the first self correction processing part 45b.

The second self correction processing part 45d has functions to read the reference image data from the reference image data storage part 45c, to generate corrected reference image data by performing the second self correction processing of the reference image data, and to provide the corrected reference image data by the second self correction processing to the sensitivity map basic image data generating part 45e. The second self correction processing improves nonuniformity of target data to be corrected based on the target data itself without using other data. As the second self correction processing, correction processing such as fitting processing and/or contrast transformation (sometimes referred as processing with a tone curve; tone processing or gamma correction processing) can be performed. This second self correction processing can acquire corrected reference image data that is more uniform than the reference image data that is uniform to some extent such as WBC image data acquired under a low magnetic field, PAC image data after the first self correction processing and WBC image data acquired under a high magnetic field.

The sensitivity map basic image data generating part 45e has functions to acquire PAC image data, which is acquired by performing a sensitivity map pre-scan with setting the phased array coil 24b as a receive coil, from the image database 44 and generating sensitivity map basic data used for generating processing of sensitivity map data by dividing the acquired PAC image data by corrected reference image data after the second self correction processing acquired from the second self correction processing part 45d, and to provide the sensitivity map basic data to the sensitivity map data calculating part 45f. In addition, the sensitivity map basic image data generating part 45e is configured to perform a processing technique such as threshold processing and/or region reduction processing, and/or other known processing techniques to PAC image data and/or corrected reference image data as preprocessing together for division processing of the PAC image data by the corrected reference image data as needed.

This threshold processing is processing for masking regions where signal intensities of data are not over a threshold preset to a signal intensity that is considered to be zero intensity. According to this threshold processing, unnecessary data in a region that is considered to be a no-signal region such as a lung field and an external region of the object P can be excluded from generating processing of sensitivity map basic data and/or sensitivity map data.

The region reduction processing is processing for reducing a region to be a target of generating processing of sensitivity map data and/or sensitivity map basic data. According to this region reduction processing, a part having low signal intensities, adjacent to masked region, in data after the threshold processing can be excluded from generating processing of sensitivity map basic data and/or sensitivity map data.

The sensitivity map data calculating part 45f has functions to calculate sensitivity map data of the respective coil elements 24c by performing generating processing of sensitivity map data with sensitivity map basic data acquired from the sensitivity map basic image data generating part 45e, and to write the calculated sensitivity map data into the sensitivity map database 46. An example of generating processing of sensitivity map data is a series of processing including normalization processing, linear interpolation processing, region growing processing, weighting processing in a slice direction and three-dimensional smoothing filter processing. Each processing can be switched between on and off as needed.

The linear interpolation processing is processing for transforming a no-signal region of data into a signal region by a linear interpolation.

The region growing processing is processing for extending a signal region by interpolating data in a no-signal region in an external region of the object P.

The respective pieces of processing can generate uniform three-dimensional sensitivity map data with less locally ups and downs of values and with improved spatial continuity and uniformity, from sensitivity map basic data.

(Operation and Action)

Then, the operation and action of a magnetic resonance imaging apparatus 20 will be described.

Figure 15:
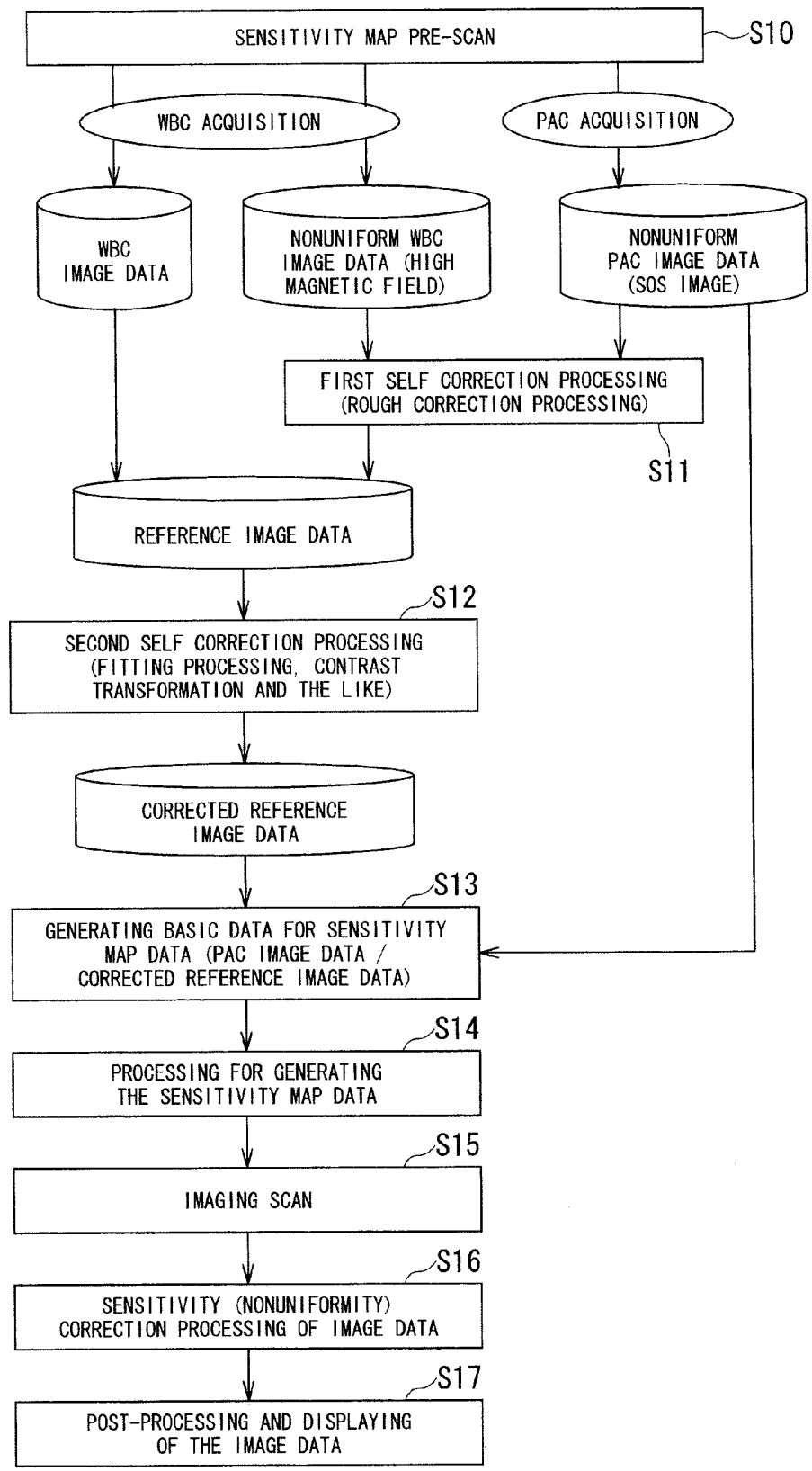
FIG. 15 is a flowchart showing a procedure for imaging an object with sensitivity correction using sensitivity map data with a phased array coil, having the plural coil elements, as a receive coil by the magnetic resonance imaging apparatus shown in FIG. 8.

FIG. 15 is a flowchart showing a procedure for imaging an object P with sensitivity correction using sensitivity map data with a phased array coil 24b, having the plural coil elements 24c, as a receive coil by the magnetic resonance imaging apparatus 20 shown in FIG. 8. The symbols each including S with a number in FIG. 15 indicate respective steps of the flowchart.

First in step S10, a sensitivity map pre-scan is performed by using both the WB coil 24a and the phased array coil 24b, or only the phased array coil 24b as receive coils. It is preferable that reference basic image data, for generating sensitivity map data, acquired by the sensitivity map pre-scan is image data having a low contrast for considering the content of processing of the reference basic image data. Therefore, the sensitivity map pre-scan is performed under imaging conditions in which a TR (repetition time)=200 ms, a TE (echo time)=4 ms, a flip angle=15 degrees and the number of slices=approximately 23 by a GFE (Gradient Field Echo) method by which an excitation pulse having a low flip angle is applied or a two-dimensional GFE method, for example.

For that purpose, the object P is set to the bed 37, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

Then, the input device 33 sends an instruction for starting a sensitivity map pre-scan to the sequence controller control unit 41. Accordingly, the sequence controller control unit 41 supplies an imaging condition, for a sensitivity map pre-scan, including coil information indicating coils used as receive coils and pulse sequence information received from the imaging condition setting unit 40 to the sequence controller 31. Therefore, the sequence controller 31 drives the gradient power supply 27, the transmitter 29, and the receiver 30 in accordance with the imaging condition, for the sensitivity map pre-scan, received from the sequence controller control unit 41, thereby generating a gradient magnetic field in the imaging area having the set object P, and further generating RF signals from the RF coil 24.

Consequently, the RF coil 24, which is selected as a receive coil, receives NMR signals generated due to nuclear magnetic resonance in the object P. Then, the receiver 30 receives the NMR signals from the RF coil 24 and generates raw data which is digital data of NMR signals by A/D conversion subsequently to necessary signal processing. The receiver 30 supplies the generated raw data to the sequence controller 31. The sequence controller 31 supplies the raw data to the sequence controller control unit 41. The sequence controller control unit 41 arranges the raw data as k-space data to the k space formed in the k-space database 42.

Subsequently, the image reconstruction unit 43 reads the k-space data from the k-space database 42 and performs image reconstruction processing to the read k-space data, thereby reconstructing image data. The reconstructed image data is written in the image database 44. Therefore, image data acquired by the sensitivity map pre-scan is stored in the image database 44

When receive coils in the sensitivity map pre-scan are the WB coil 24a and the phased array coil 24b, WBC image data and PAC image data such as SOS image data are stored in the image database 44. Meanwhile, when a receive coil in the sensitivity map pre-scan is only the phased array coil 24b, only PAC image data is stored in the image database 44. WBC image data acquired under a low magnetic field becomes uniform to some extent, but WBC image data acquired under a high magnetic field and PAC image data become nonuniform.

Accordingly, when nearly uniform image data can not be acquired, the first self correction processing, as rough correction processing of nonuniformity, of nonuniform WBC image data or PAC image data is performed in step S11. That is, the reference basic image data acquisition part 45a acquires nonuniform WBC image data or PAC image data as reference basic image data from the image database 44 and provides it to the first self correction processing part 45b. Then, the first self correction processing part 45b generates uniform reference image data to some extent by performing the first self correction processing, such as threshold processing, region reduction processing, interpolation processing, extrapolation processing and smoothing processing with a spatial low-pass filter, on the nonuniform reference basic image data. The generated reference image data is written and stored in the reference image data storage part 45c.

Meanwhile, when the reference basic image data acquisition part 45a acquires nearly uniform WBC image data from the image database 44, the WBC image data is written and stored in the reference image data storage part 45c as reference image data, as it is.

Then in step S12, the second self correction processing is performed on nearly uniform reference image data as nonuniformity correction processing. That is, the second self correction processing part 45d loads the reference image data from the reference image data storage part 45c and generates more uniform corrected reference image data than the nearly uniform reference image data after the second self correction processing by performing fitting processing and/or contrast transformation processing, as the second self correction processing, on the reference image data.

Then in step S13, sensitivity map basic data used for generating processing of sensitivity map data is generated by dividing the PAC image data by the corrected reference image data. That is, the sensitivity map basic image data generating part 45e acquires the PAC image data acquired by performing the sensitivity map pre-scan from the image database 44 and generates the sensitivity map basic data by dividing the PAC image data by the corrected reference image data acquired from the second self correction processing part 45d. In addition, threshold processing and/or region reduction processing is performed, as needed, on the PAC image data and/or the corrected reference image data as preprocessing for generating processing of the sensitivity map basic data.

Then in step S14, processing for generating sensitivity map data with the sensitivity map basic data is performed. That is, the sensitivity map data calculating part 45f calculates the sensitivity map data of the respective coil elements 24c by performing processing for generating the sensitivity map data such as normalization processing, linear interpolation processing, region growing processing, weighting processing in a slice direction and/or three-dimensional smoothing filter processing with using the sensitivity map basic data acquired from the sensitivity map basic image data generating part 45e. Then, the acquired sensitivity map data is written and stored in the sensitivity map database 46.

Then in step S15, an imaging scan is performed as the main scan by using desired multiple coil elements 24c included in the phased array coil 24b as receive coils. That is, the imaging scan is performed according to an imaging condition for PI in a flow similar to the sensitivity map pre-scan. Consequently, plural pieces of image data, acquired by the imaging scan, corresponding to the respective coil elements 24c are stored in the image database 44.

Then in step S16, sensitivity correction of the image data acquired by the imaging scan is performed. That is, the sensitivity correction unit 47 loads the image data acquired by performing the imaging scan from the image database 44 and performs sensitivity correction processing of the image data based on the sensitivity map data loaded from the sensitivity map database 46.

Then in step S17, post-processing is performed on the image data after the sensitivity correction and the image data after post-processing is provided to the display unit 34 so that the image data after post-processing is displayed on the display unit 34. The post-processing is performed in the image processing unit 48. Examples of post-processing include processing such as unfolding processing of PI and MIP (maximum intensity projection) processing for displaying three-dimensional image data. The sensitivity map data of each coil element 24c is used for unfolding processing.

That is, as shown in FIG. 15, nonuniformity of reference image data itself used for calculation of sensitivity map data on assumption that the reference image data is uniform is corrected by the second self correction processing based on the nearly uniform reference image data. This can calculate sensitivity map data with a high degree of accuracy.

Moreover, nonuniform WBC image data or PAC image data can be used as nearly uniform reference image data by performing the rough first self correction processing of the nonuniform WBC image data or the PAC image data.

Especially, it's an undeniable situation that nonuniformity in sensitivity of PAC image data occurs to some extent with technological progress in PI technology. However, the second self correction processing is performed on nearly uniform image data with a low contrast. Accordingly, when PAC image data is used as reference image data as it is, sensitivity map data might not be acquired with a satisfactory accuracy. For this reason, by performing the first self correction processing, that is the rough correction processing of nonuniformity, of nonuniform PAC image data as preprocessing, nearly uniform reference image data can be generated even from the nonuniform PAC image data. Consequently, the second self correction processing such as fitting processing and/or contrast transformation processing can be performed on nearly uniform PAC image data after the first self correction processing.

The causes of insufficient uniformity in reference basic image data acquired by a sensitivity map pre-scan includes influence of nonuniformity due to dielectric artifact in a high magnetic field MRI of recent years. The influence of nonuniformity due to a dielectric artifact generally causes high signals in the center part of axial image data. For this reason, by performing the first self correction processing of nonuniform WBC image data acquired under a high magnetic field as well as nonuniform PAC image data, the second self correction processing such as fitting processing and/or contrast transformation processing can be performed even though the WBC image data is nonuniform.

Figure 16:
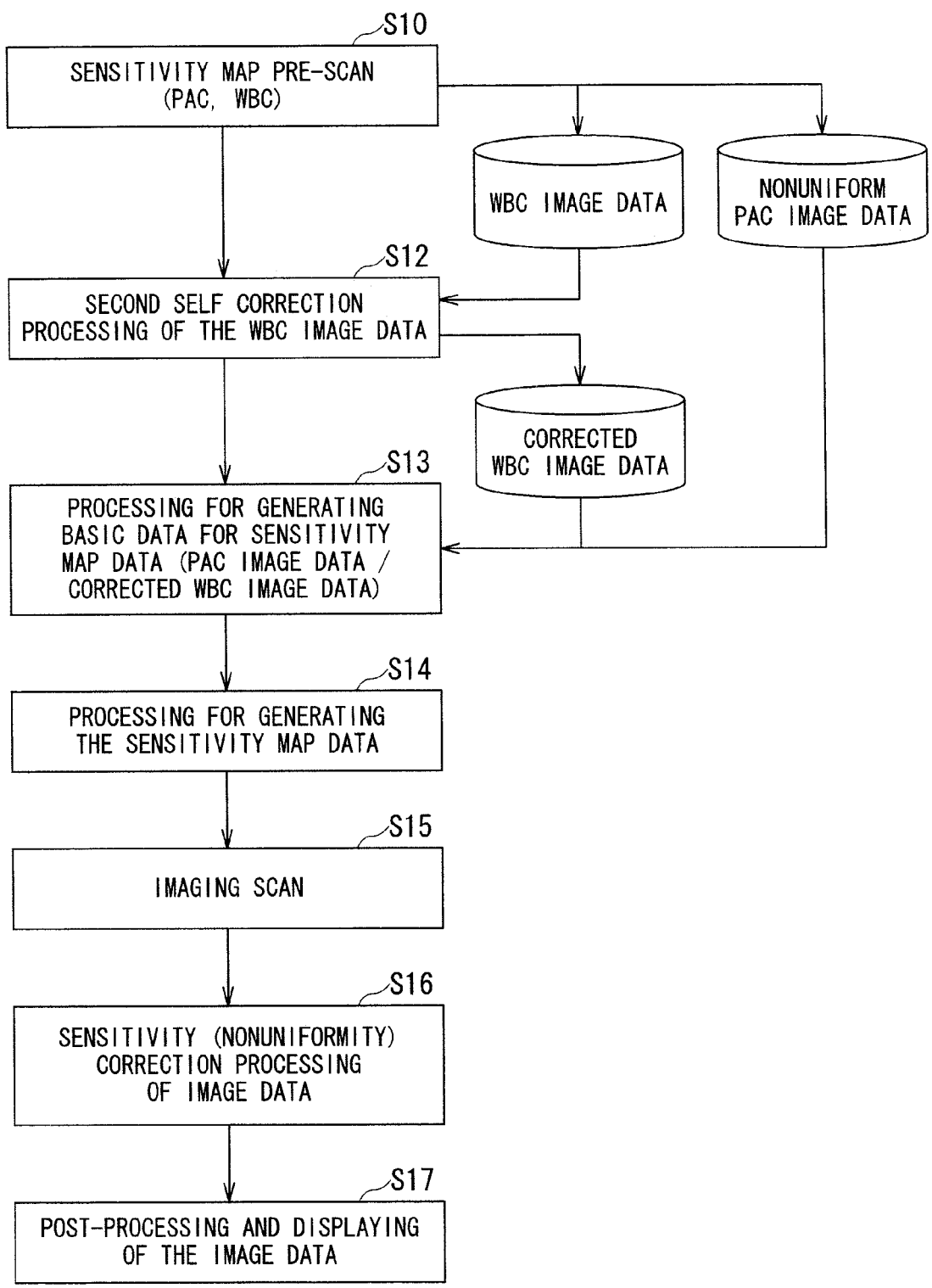
FIG. 16 is a flowchart showing a procedure in case of performing a sensitivity map pre-scan with both the WB coil and the phased array coil as receive coils in the flowchart shown in FIG. 15.

FIG. 16 is a flowchart showing a procedure in case of performing a sensitivity map pre-scan with both the WB coil 24a and the phased array coil 24b as receive coils in the flowchart shown in FIG. 15. The symbols each including S with a number in FIG. 16 indicate respective steps of the flowchart. Note that, the same sign as that in FIG. 15 is attached with a step corresponding to each step shown in FIG. 15, and description about common matters is omitted.

As shown in FIG. 16, when a sensitivity map pre-scan is performed using both the WB coil 24a and the phased array coil 24b as receive coils in step S10, nearly uniform WBC image data and nonuniform PAC image data can be acquired. The nearly uniform WBC image data can be used as reference image data as it is. For this reason, in step S12, corrected WBC image data can be generated as corrected reference image data by the second self correction processing of the WBC image data. Moreover, sensitivity map basic data can be generated by dividing the nonuniform PAC image data by corrected WBC image data in step S13.

Figure 17:
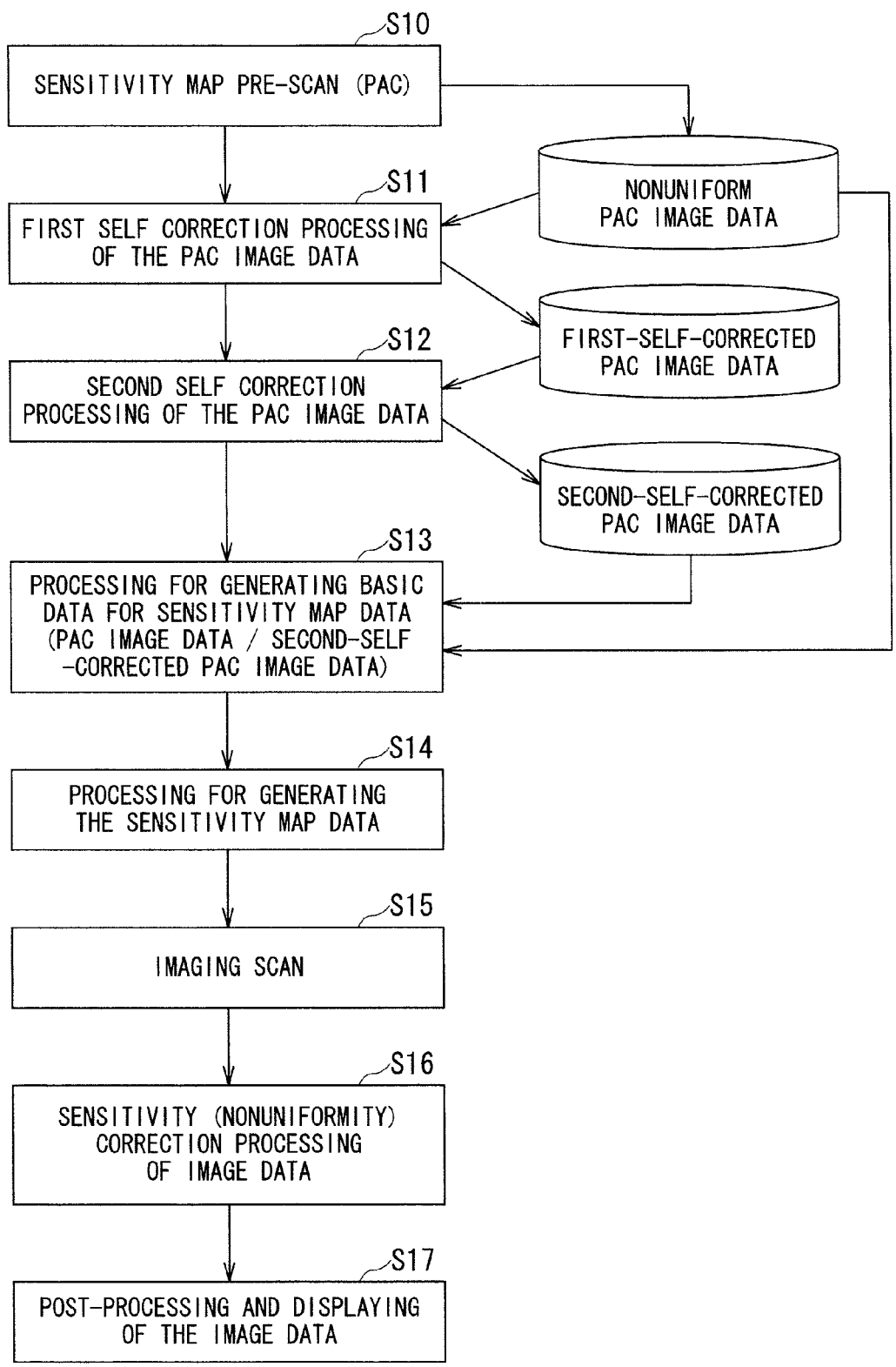
FIG. 17 is a flowchart showing a procedure in case of performing a sensitivity map pre-scan with only the phased array coil as a receive coil in the flowchart shown in FIG. 15.

FIG. 17 is a flowchart showing a procedure in case of performing a sensitivity map pre-scan with only the phased array coil 24b as a receive coil in the flowchart shown in FIG. 15. The symbols each including S with a number in FIG. 17 indicate respective steps of the flowchart. Note that, the same sign as that in FIG. 15 is attached with a step corresponding to each step shown in FIG. 15, and description about common matters is omitted.

As shown in FIG. 17, when a sensitivity map pre-scan is performed by using only the phased array coil 24b as a receive coil in step S10, only nonuniform PAC image data can be acquired. Then in step S11, nearly uniform corrected PAC image data by the first self correction can be acquired by performing the first self correction processing of nonuniform PAC image data. Then in step S12, more uniform PAC image data corrected by the second self correction can be acquired by performing the second self correction processing of the PAC image data corrected by the first self correction. Moreover, sensitivity map basic data can be generated by dividing the nonuniform PAC image data by the PAC image data corrected by the second self correction in step S13.

Meanwhile, the same applies in case where nonuniform WBC image data is acquired by a sensitivity map pre-scan.

Next, the detailed processing procedure of the second self correction processing will be described.

Examples of the second self correction processing include either fitting processing or contrast transformation processing, and both fitting processing and contrast transformation processing. For this reason, the detailed procedure of fitting processing will be described first.

Figure 18:
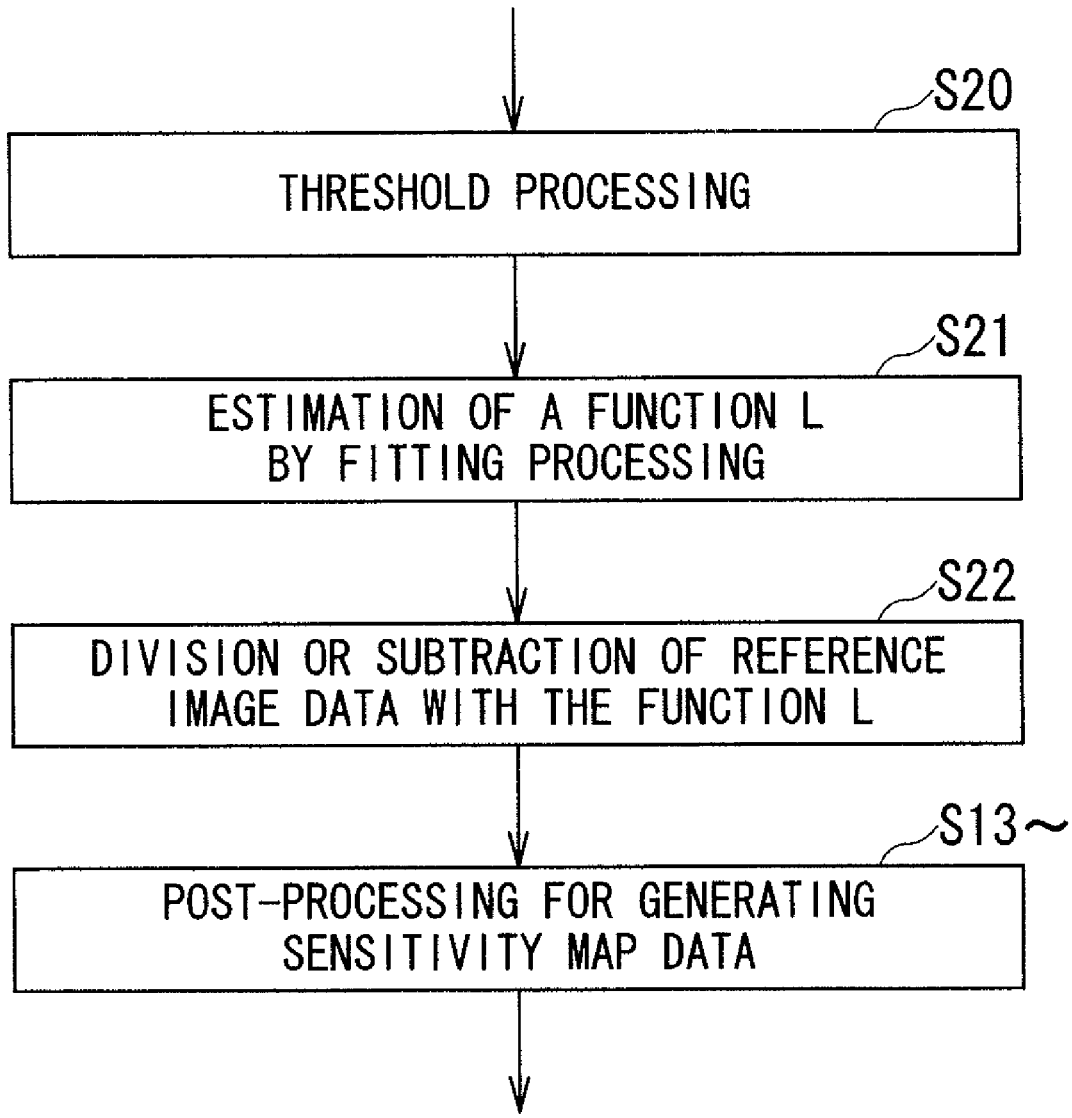
FIG. 18 is a flowchart showing a detail procedure in case of performing spatial fitting processing as the second self correction processing in the flowchart shown in FIG. 15.
Figure 19:
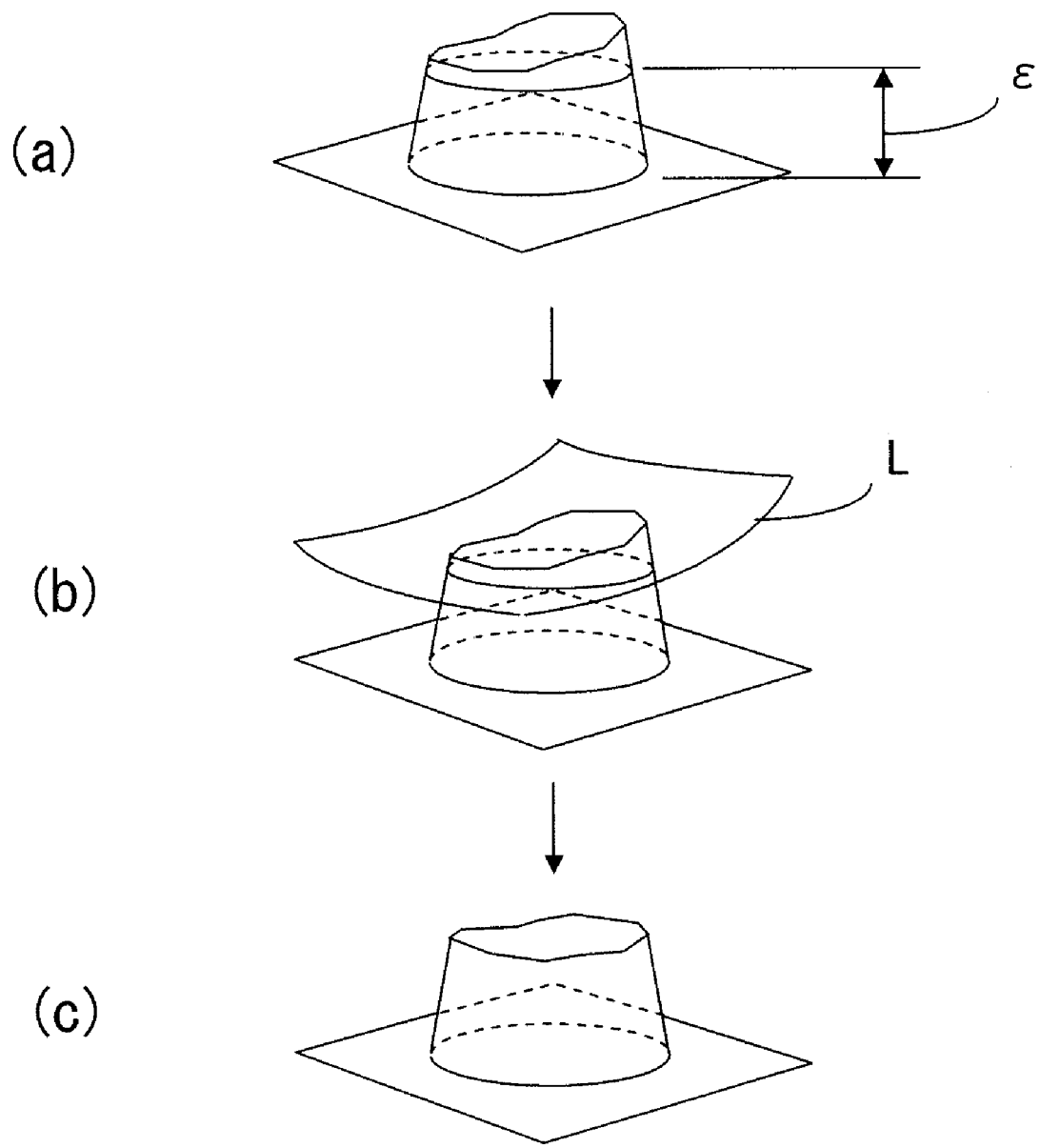
FIG. 19 is a schematic diagram showing each piece of data generated by processing shown in FIG. 18.

FIG. 18 is a flowchart showing a detail procedure in case of performing spatial fitting processing as the second self correction processing in the flowchart shown in FIG. 15. The symbols each including S with a number in FIG. 18 indicate respective steps of the flowchart. FIG. 19 is a schematic diagram showing each piece of data generated by processing shown in FIG. 18.

When reference image data to be a target of the second self correction processing is image data having a low contrast, generally a region of the reference image data other than a no-signal region has a relatively less signal fluctuation.

For that reason, in step S20 in FIG. 18, threshold processing is performed on the reference image data to exclude regions not over a threshold value $\in$, which is preset with regard to a signal intensity of the reference image data, from a target of fitting processing. That is, as shown in FIG. 19(a), threshold processing of the reference image data is performed with the threshold value $\in$.

Then in step S21 in FIG. 18, by performing fitting processing, such as a least-square method, of the reference image data, after threshold processing, in a processing target region showing a value larger than a certain threshold value $\in$, a function L which represents low-frequency components corresponding to sensitivity unevenness of the reference image data is estimated over the whole space. That is, the function L as shown in FIG. 19(b) is estimated. Note that, fitting processing to estimate sensitivity unevenness can be performed by performing processing such as extrapolation processing, smoothing processing, unfolding processing with an orthogonal function like a Legendre function and TPS (thin-plate splines) fitting processing independently or in combination. That is, the fitting processing such as a smoothly-varied function L can be acquired is performed.

When the unfolding processing is performed, component changing gradually can be excluded by subtracting components other than a zero order component from unfolding coefficients. The TPS fitting is processing to fit a TPS, that is a curved surface defined as a combination of plural base functions having logarithms, to data. The details of the TPS fitting are described in the international publication No. 02/056767 pamphlet.

Then in step S22 in FIG. 18, corrected reference image data can be calculated by division or subtraction of the reference image data by the function L. Note that, it is possible to calculate corrected value data by division or subtraction of the pieces of reference image data each having a value not lower than the threshold value $\in$ by the function L, and to calculate corrected reference image data in the whole space by extrapolation processing of data at points other than points in the corrected value data. On the contrary, corrected reference image data over the whole space can be also calculated by division or subtraction using all components of the function L acquired by the unfolding processing or an approximate function of the function L. This can generate uniform corrected reference image data as shown in FIG. 19(c).

A post-processing for generating three-dimensional sensitivity map data after step S13 in FIG. 15 is performed on the generated corrected reference image data. Then, sensitivity correction of image data acquired by an imaging scan is performed based on the generated sensitivity map data.

Then, a detailed procedure in case of performing a nonlinear contrast transformation processing as the second self correction processing will be described. The second self correction processing that performs only the nonlinear contrast transformation processing compresses high signal parts in the reference image data by a nonlinear transform of a contrast of the reference image data with a desired transform function.

Figure 20:
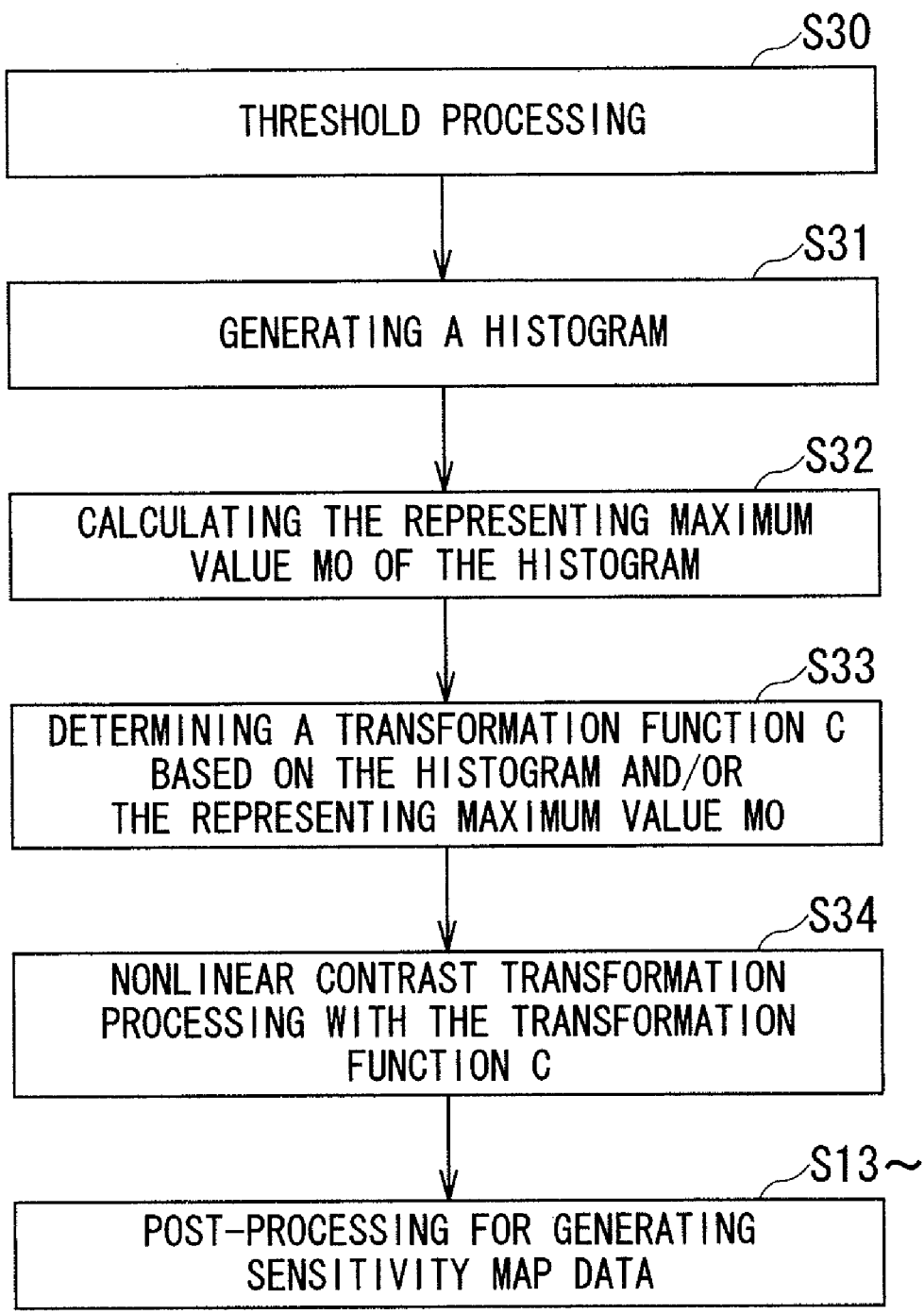
FIG. 20 is a flowchart showing a detail procedure in case of performing nonlinear contrast transformation processing as the second self correction processing in the flowchart shown in FIG. 15.
Figure 21:
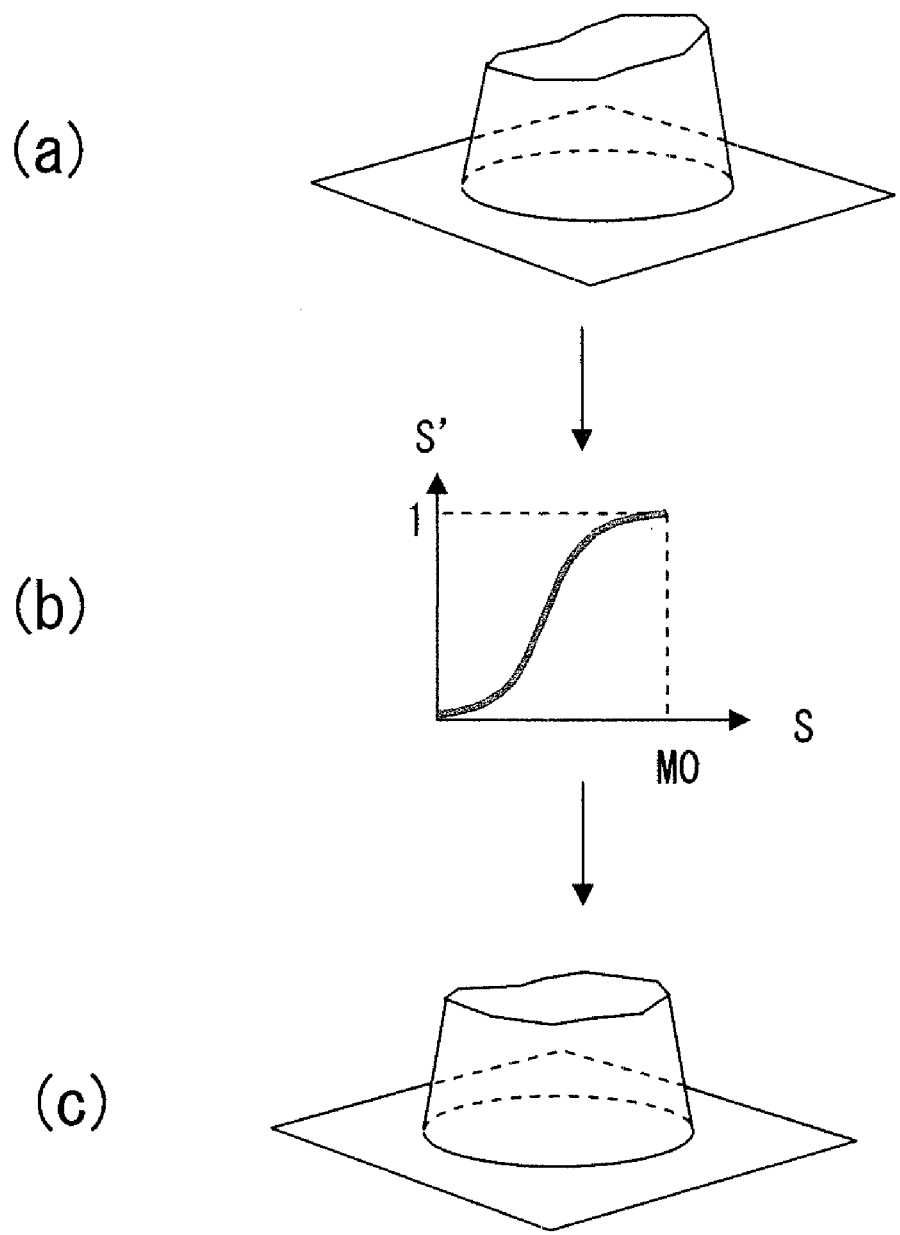
FIG. 21 is a schematic diagram showing each piece of data generated by processing shown in FIG. 20.

FIG. 20 is a flowchart showing a detail procedure in case of performing nonlinear contrast transformation processing as the second self correction processing in the flowchart shown in FIG. 15. The symbols each including S with a number in FIG. 20 indicate respective steps of the flowchart. FIG. 21 is a schematic diagram showing each piece of data generated by processing shown in FIG. 20.

When the reference image data to be a target of the second self correction processing as shown in FIG. 21(a) is image data showing a low contrast, generally a part of the reference image data other than a no-signal part has s relatively less signal fluctuation.

For that reason, in step S30 in FIG. 20, threshold processing is performed on the reference image data to exclude a region, not over a threshold value ∈ preset with regard to a signal intensity of the reference image data, from a target of the fitting processing.

Then, a histogram (frequency distribution diagram) of the reference image data after threshold processing is generated in step S31.

Then, the representing maximum value MO of the histogram is calculated in step S32. For example, if the maximum value of the histogram obtained by excluding pixel data contained in the top 3% in value size is set as the representing maximum value M0 of the histogram, influence by a few of pixels each showing a high signal value as a singular value can be suppressed to calculate the representing maximum value M0 of the histogram stably. If no singular value exists, the maximum value of the histogram can be set as the representing maximum value M0 as it is.

Then, in step S33, a desired curve to perform the nonlinear transformation is determined as a transformation function C based on the histogram and/or the representing maximum value M0 of the histogram. A S-shaped curve or a curve corresponding to an upper half part of a S-curve can be used as a transformation function C. For example as shown in FIG. 21(b), a sigmoidal curve by which the signal intensity S corresponding to the representing maximum value M0 of the histogram is transformed to the signal intensity S'=1 can be regarded as a transformation function C. When a nonlinear transformation of the reference image data is performed with this type of curve, the signal values of the reference image data can be standardized by the representing maximum value M0 of the histogram. Various parameters to determine the curve can be changed to appropriate values according to an image contrast and/or a resolution determined by imaging parameters.

Then, in step S34, a nonlinear contrast transformation processing of the reference image data with the transformation function C is performed. Consequently, for example as shown in FIG. 21(c), uniform corrected reference image data having a compressed high signal part can be generated. In addition, a singular value of the reference image data larger than the representing maximum value M0 can be transformed to a uniform value by performing contrast transformation with the transformation function C standardized by the representing maximum value M0 of the histogram.

Then, post-processing for generating three-dimensional sensitivity map data after step S13 in FIG. 15 is performed on the generated corrected reference image data.

Figure 22:
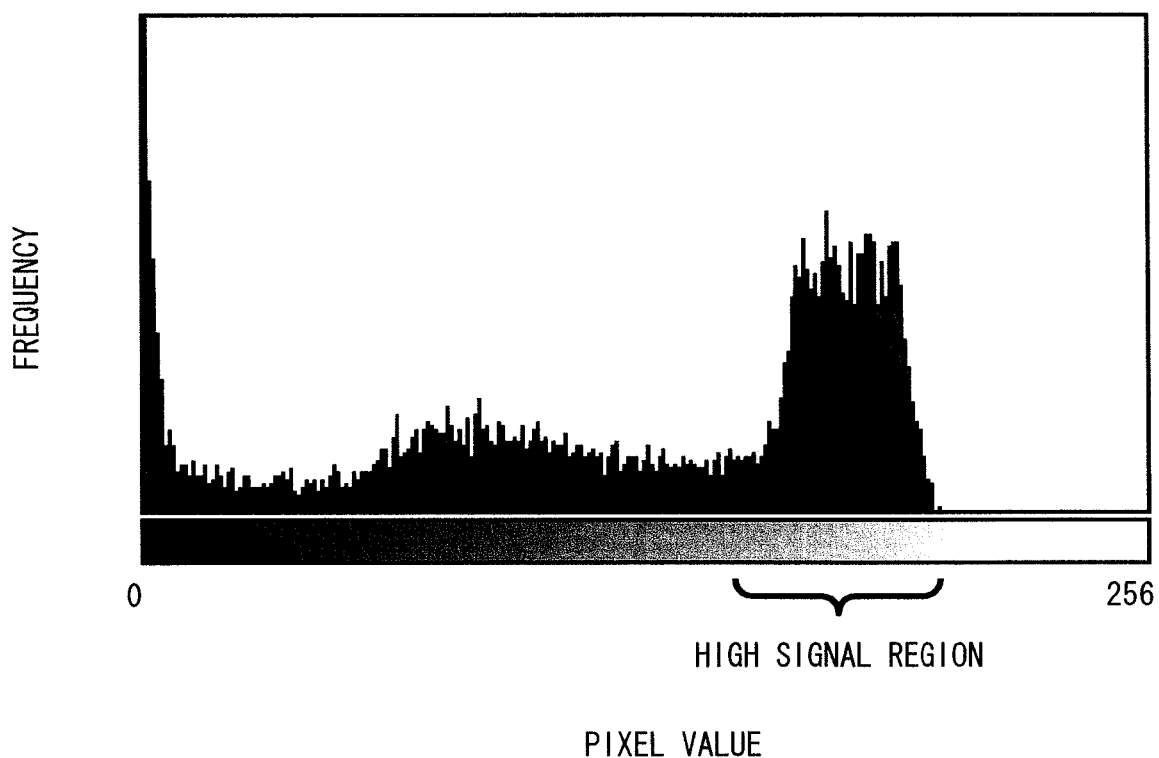
FIG. 22 is a diagram showing an example of histogram of the reference image data generated in step S31 of the flowchart shown in FIG. 20.
Figure 23:
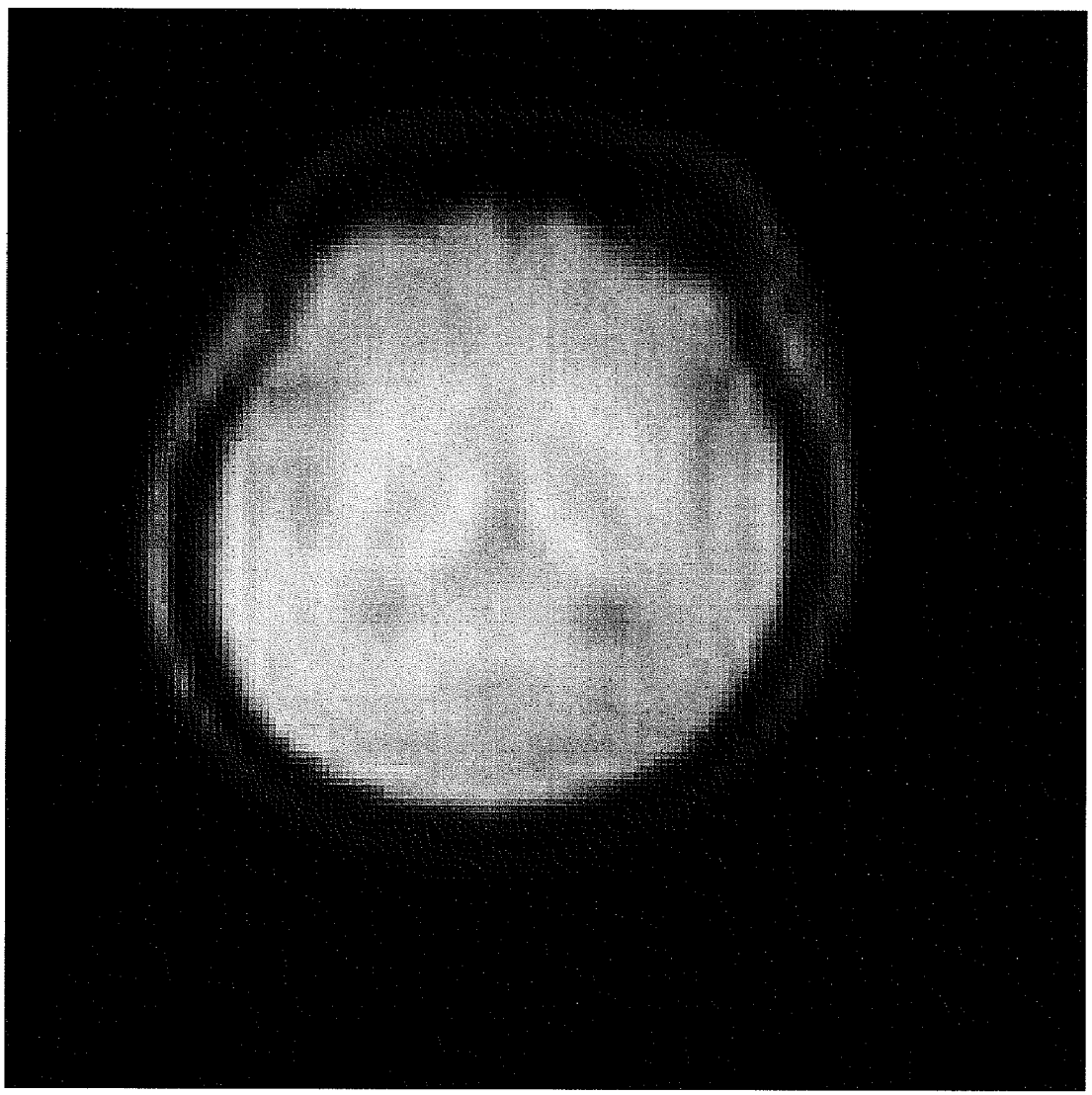
FIG. 23 is a diagram showing WBC image data serving as a basis of the histogram shown in FIG. 22.

FIG. 22 is a diagram showing an example of histogram of the reference image data generated in step S31 of the flowchart shown in FIG. 20. FIG. 23 is a diagram showing WBC image data serving as a basis of the histogram shown in FIG. 22.

In FIG. 22, the abscissa axis denotes signal intensities and the ordinate axis denotes frequencies. In the histogram of WBC image data as shown in FIG. 22, a broadening upper part having high frequencies and relatively high signal intensities shows nonuniformity due to sensitivity unevenness. Therefore, sensitivity irregularity of the reference image data can be corrected to become flat by performing such a nonlinear contrast transformation that the broadening part is compressed. For that purpose, the transformation function is preferably determined so that a part of the reference image data that should be flattened is transformed by a part of the transform function whose inclination is flat.

Figure 24:
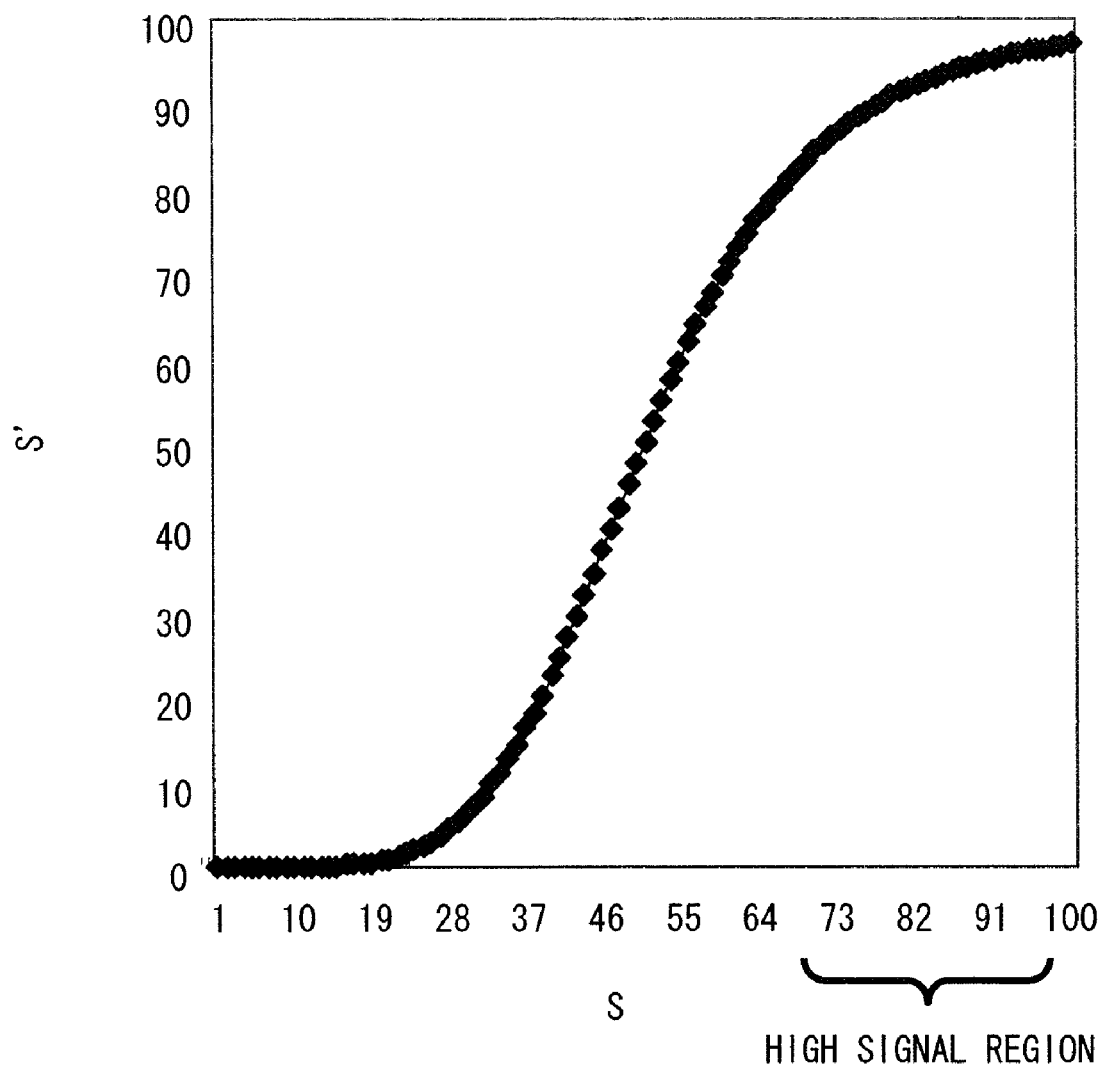
FIG. 24 is a diagram showing an example of sigmoidal curve determined in step S33 of the flowchart shown in FIG. 20.
Figure 25:
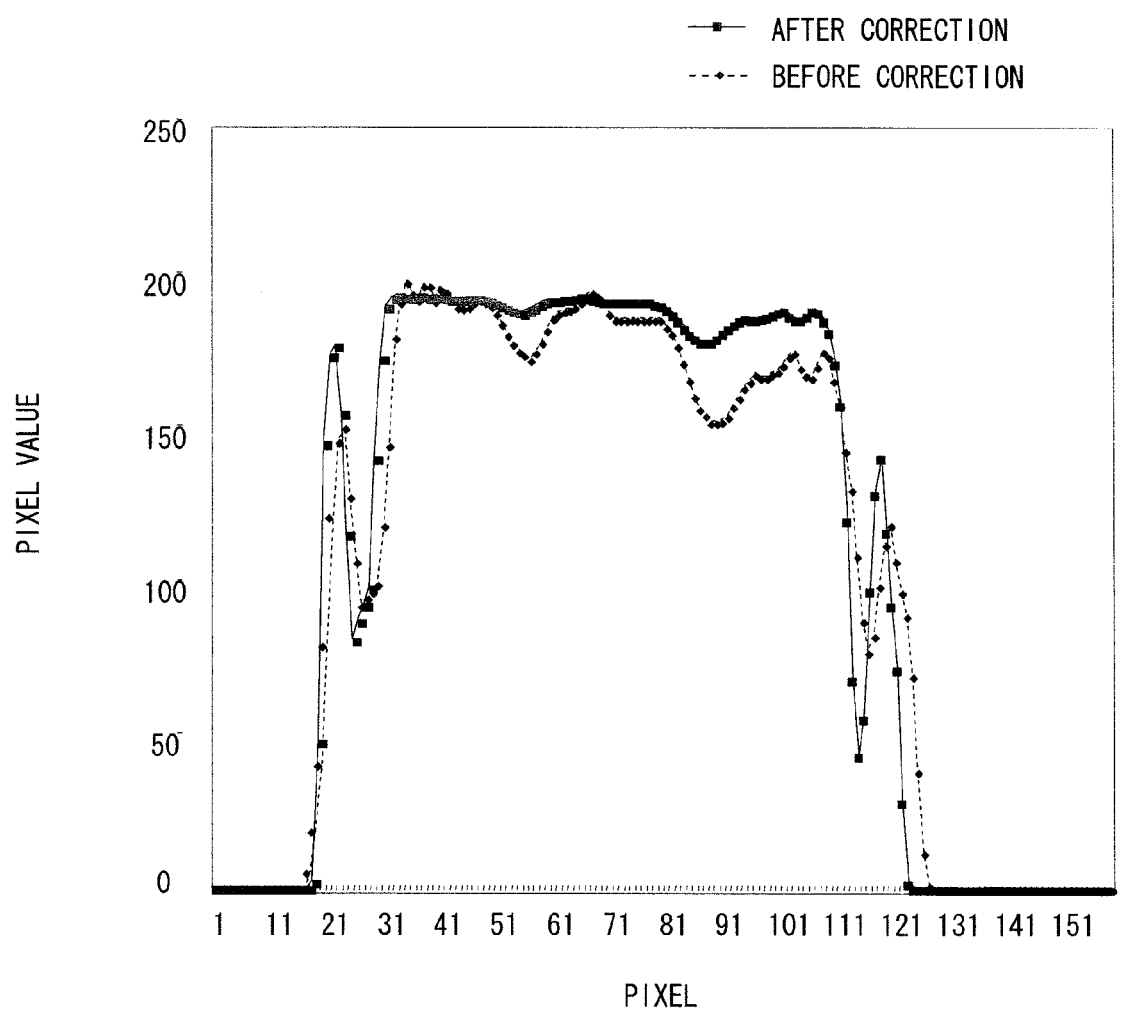
FIG. 25 is a diagram comparing a profile of corrected reference image data obtained by contrast transformation using the sigmoidal curve shown in FIG. 24 with that of a conventional reference image data.
Figure 26:
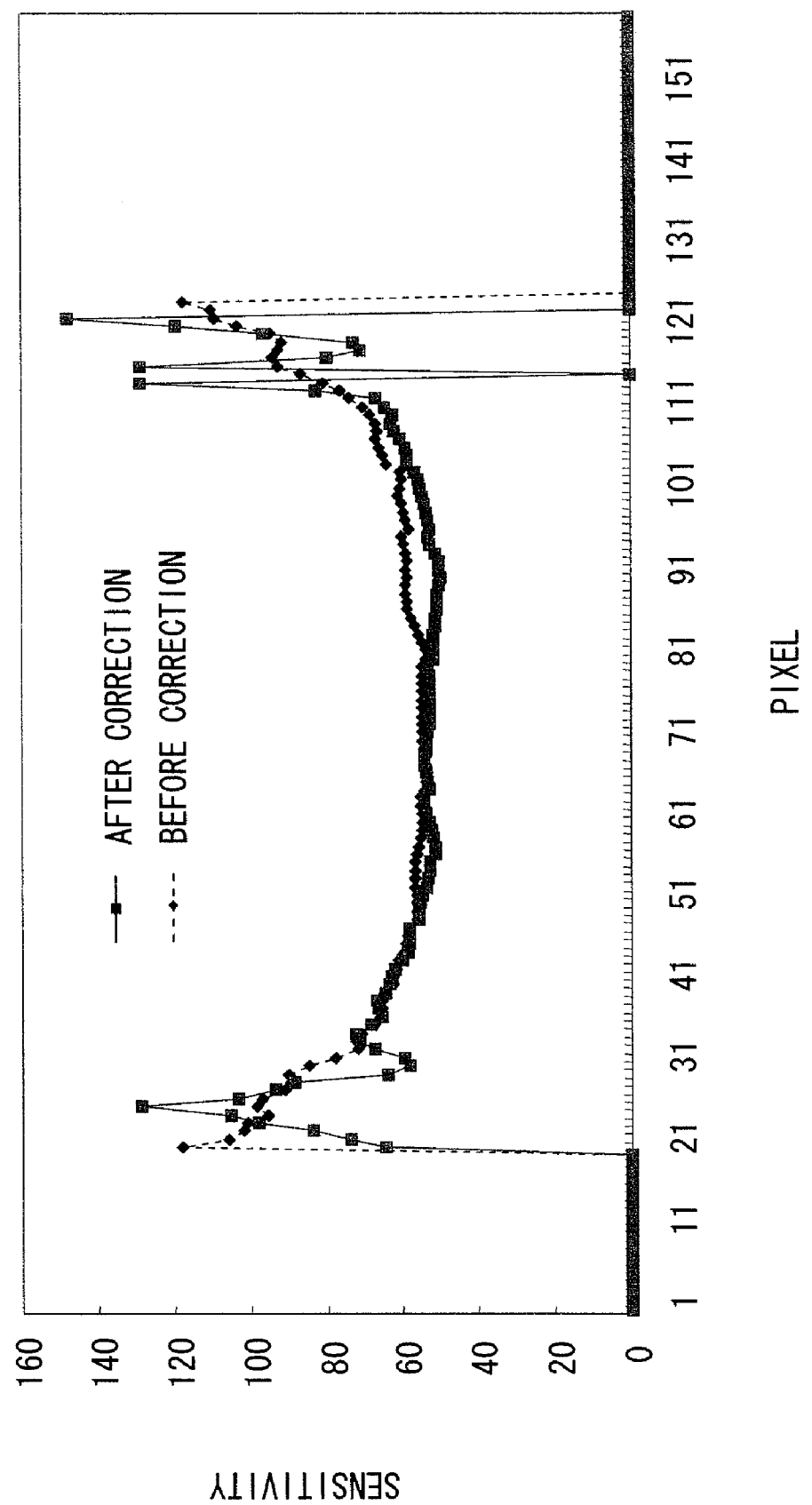
FIG. 26 is a diagram comparing sensitivity map data generated based on corrected reference image data obtained by contrast transformation using the sigmoidal curve shown in FIG. 24 with that obtained by the conventional method.

FIG. 24 is a diagram showing an example of sigmoidal curve determined in step S33 of the flowchart shown in FIG. 20. FIG. 25 is a diagram comparing a profile of corrected reference image data obtained by contrast transformation using the sigmoidal curve shown in FIG. 24 with that of a conventional reference image data. FIG. 26 is a diagram comparing sensitivity map data generated based on corrected reference image data obtained by contrast transformation using the sigmoidal curve shown in FIG. 24 with that obtained by the conventional method.

As shown in FIG. 24, a sigmoida curve C1 in common use as a contrast curve can be used as the transformation function. The sigmoidal curve C1 is expressed in the formula (1).

$$y = V\max \cdot x^n / (k^n + x^n) \tag{1}$$

In FIG. 25, the dotted line denotes a profile of a conventional WBC image data and the solid line denotes a profile of a corrected WBC image data obtained by contrast transformation using a sigmoidal curve. According to FIG. 25, it is confirmed that a profile of the corrected WBC image data acquired by the contrast transformation with the sigmoidal curve is more improved than that of conventional WCB image data.

In FIG. 26, the dotted line denotes sensitivity map data obtained by a conventional method and the solid line denotes sensitivity map data generated based on corrected WBC image data obtained by contrast transformation using the sigmoidal curve. According to FIG. 26, since a contrast is enhanced in an intermediate signal value region if the contrast transformation of the WBC image data with the sigmoidal curve is performed, it is confirmed that the estimated values of sensitivity map data in the corresponding peripheral region become abnormal. For this reason, the abnormal values in the sensitivity map data may be excluded by a low-pass filter as generating processing of the sensitivity map data. It is considered that a contrast transformation with a sigmoidal curve might become effective in case where pieces of data having relatively low signals should be excluded from calculation targets, for example.

Figure 27:
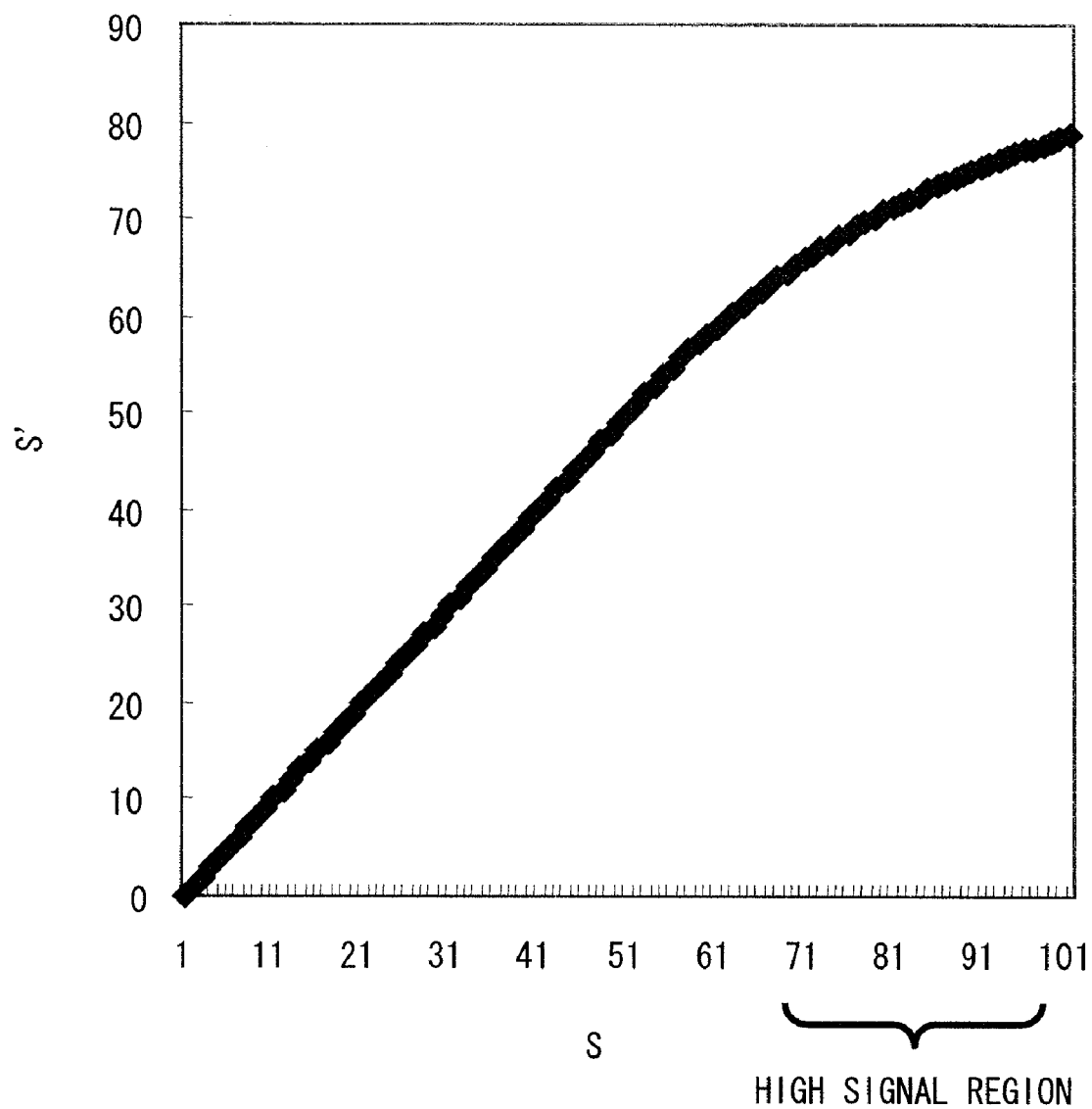
FIG. 27 is a diagram showing an example of a curve, which corresponds to an upper half part of S-curve, determined in step S33 of the flowchart shown in FIG. 20.
Figure 28:
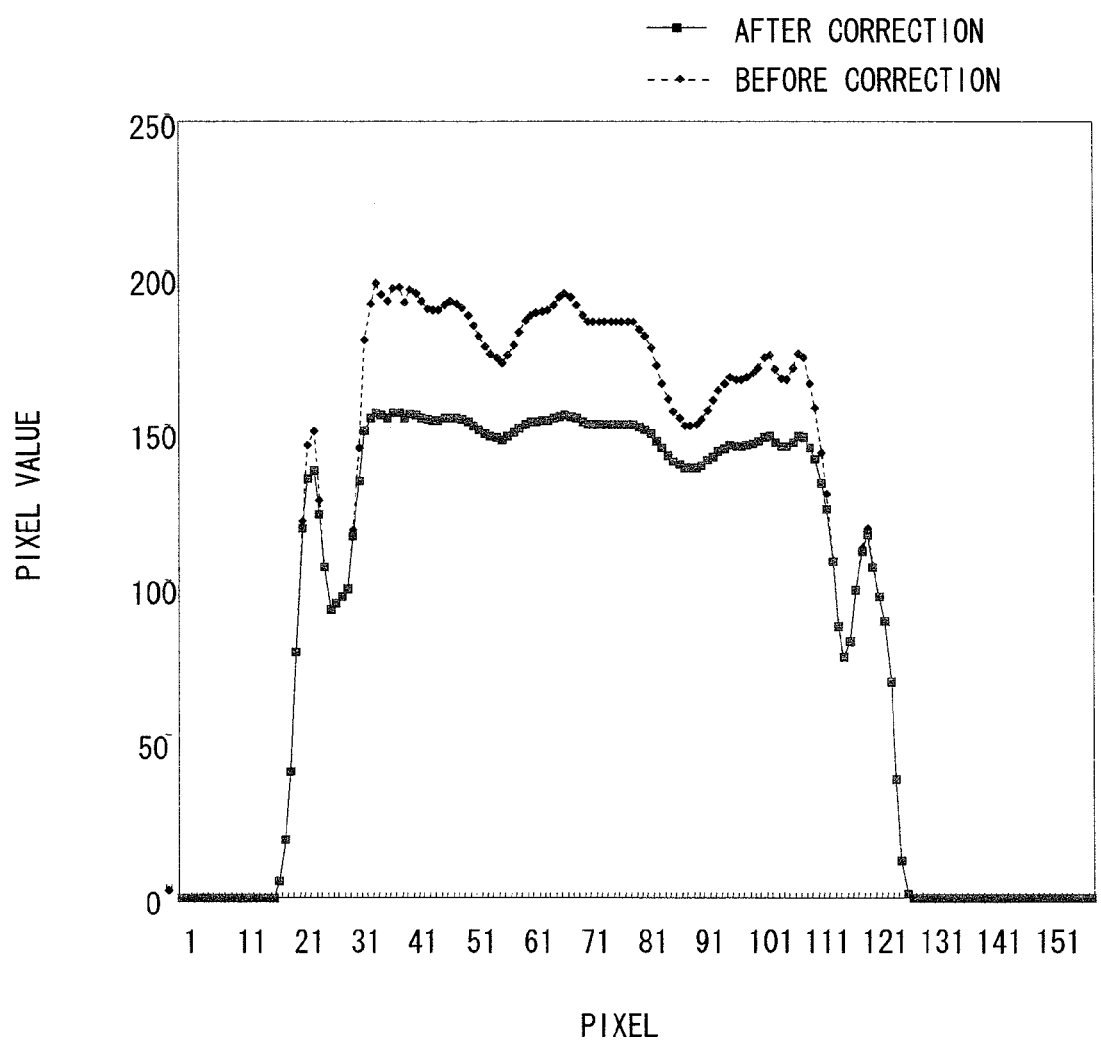
FIG. 28 is a diagram comparing a profile of corrected reference image data obtained by contrast transformation using the curve, which corresponds to the upper half part of S-curve, shown in FIG. 27 with that of a conventional reference image data.
Figure 29:
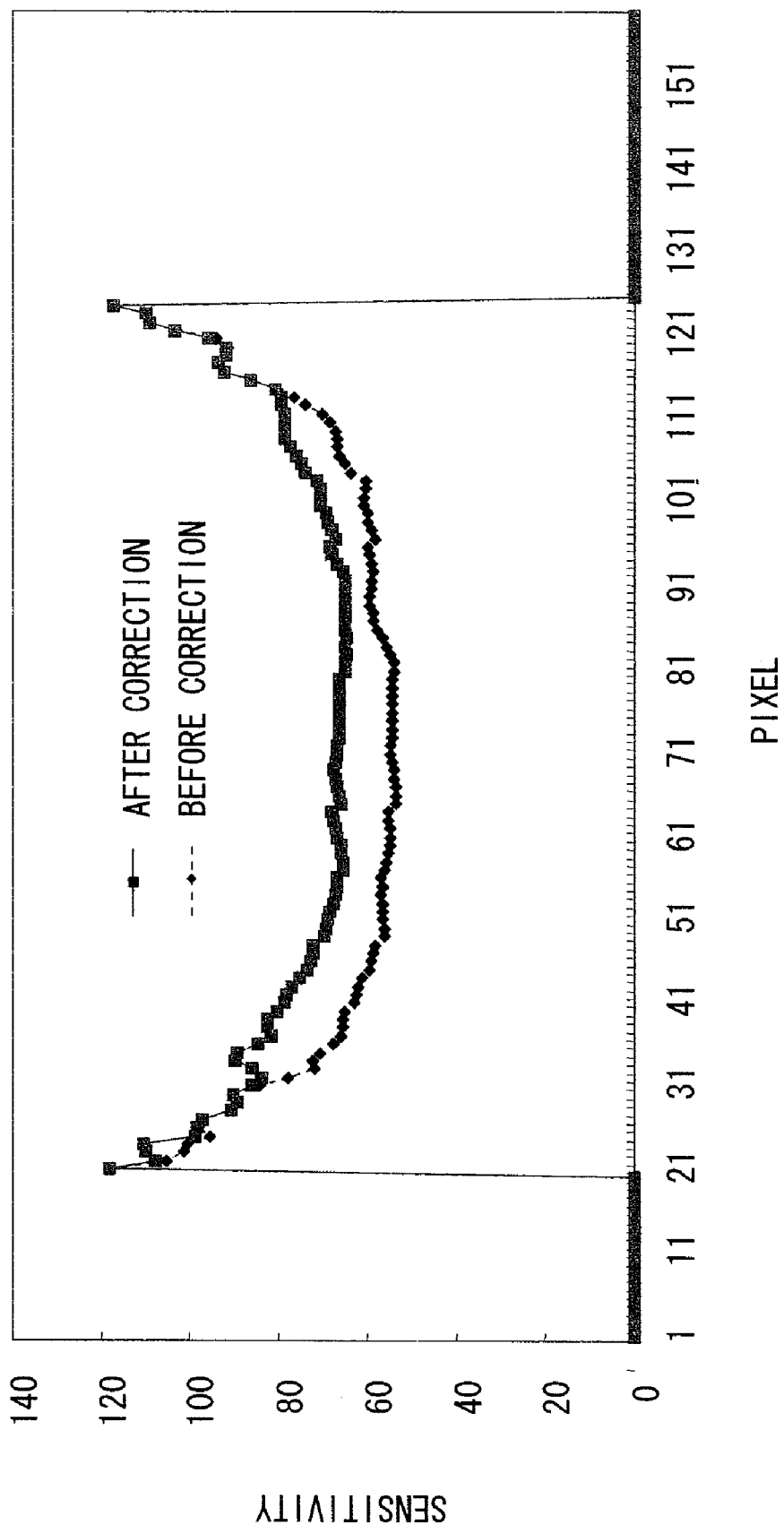
FIG. 29 is a diagram comparing sensitivity map data generated based on corrected reference image data obtained by contrast transformation using the curve, which corresponds to the upper half part of S-curve, shown in FIG. 27 with that obtained by the conventional method.

FIG. 27 is a diagram showing an example of a curve, which corresponds to an upper half part of S-curve, determined in step S33 of the flowchart shown in FIG. 20. FIG. 28 is a diagram comparing a profile of corrected reference image data obtained by contrast transformation using the curve, which corresponds to the upper half part of S-curve, shown in FIG. 27 with that of a conventional reference image data. FIG. 29 is a diagram comparing sensitivity map data generated based on corrected reference image data obtained by contrast transformation using the curve, which corresponds to the upper half part of S-curve, shown in FIG. 27 with that obtained by the conventional method.

As shown in FIG. 27, a curve C2 corresponding to an upper half part of a S-curve in common use as a contrast curve can be set as the transformation function. If the curve C2 corresponding to an upper half part of the S-curve is used as the transformation function, a part of the WBC image data showing signal values not over an intermediate signal value remains unchanged values but signal values change in high signal regions by the contrast transformation.

In FIG. 28, the dotted line denotes a profile of a conventional WBC image data and the solid line denotes a profile of a corrected WBC image data obtained by contrast transformation using the curve corresponding to the upper half part of the S-curve. According to FIG. 28, it is confirmed that a profile of the corrected WBC image data acquired by the contrast transformation with the curve corresponding to the upper half part of the S-curve has a significantly improved flatness than that of conventional WCB image data.

In FIG. 29, the dotted line denotes sensitivity map data obtained by a conventional method and the solid line denotes sensitivity map data generated based on corrected WBC image data obtained by contrast transformation using the curve corresponding to the upper half part of the S-curve. According to FIG. 29, it is confirmed that the values in peripheral region of sensitivity map data do not become abnormal. That is, it is confirmed that the values of sensitivity map data are stable.

The results shown in FIG. 26 and FIG. 29 show that it is preferable to use the curve corresponding to the upper half part of the S-curve as the transformation function from the viewpoint of acquiring better sensitivity map data. When the contrast transformation is performed with the curve corresponding to the upper half part of the S-curve, it is also preferable that basic data to be transformed is image data showing a low contrast.

Figure 1:
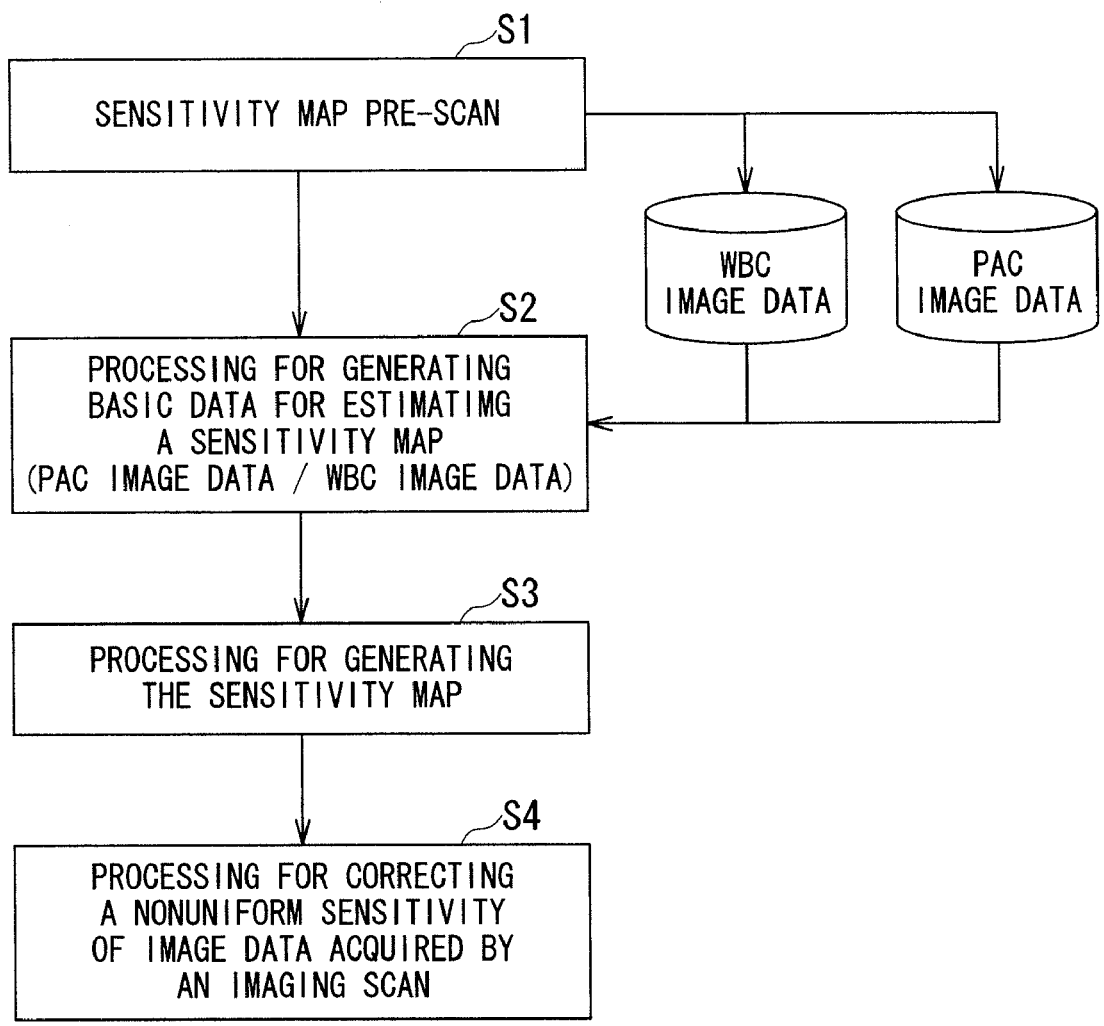
FIG. 1 is a flowchart showing a procedure of the conventional sensitivity correction processing with using a WBC as a receive coil.
Figure 2:
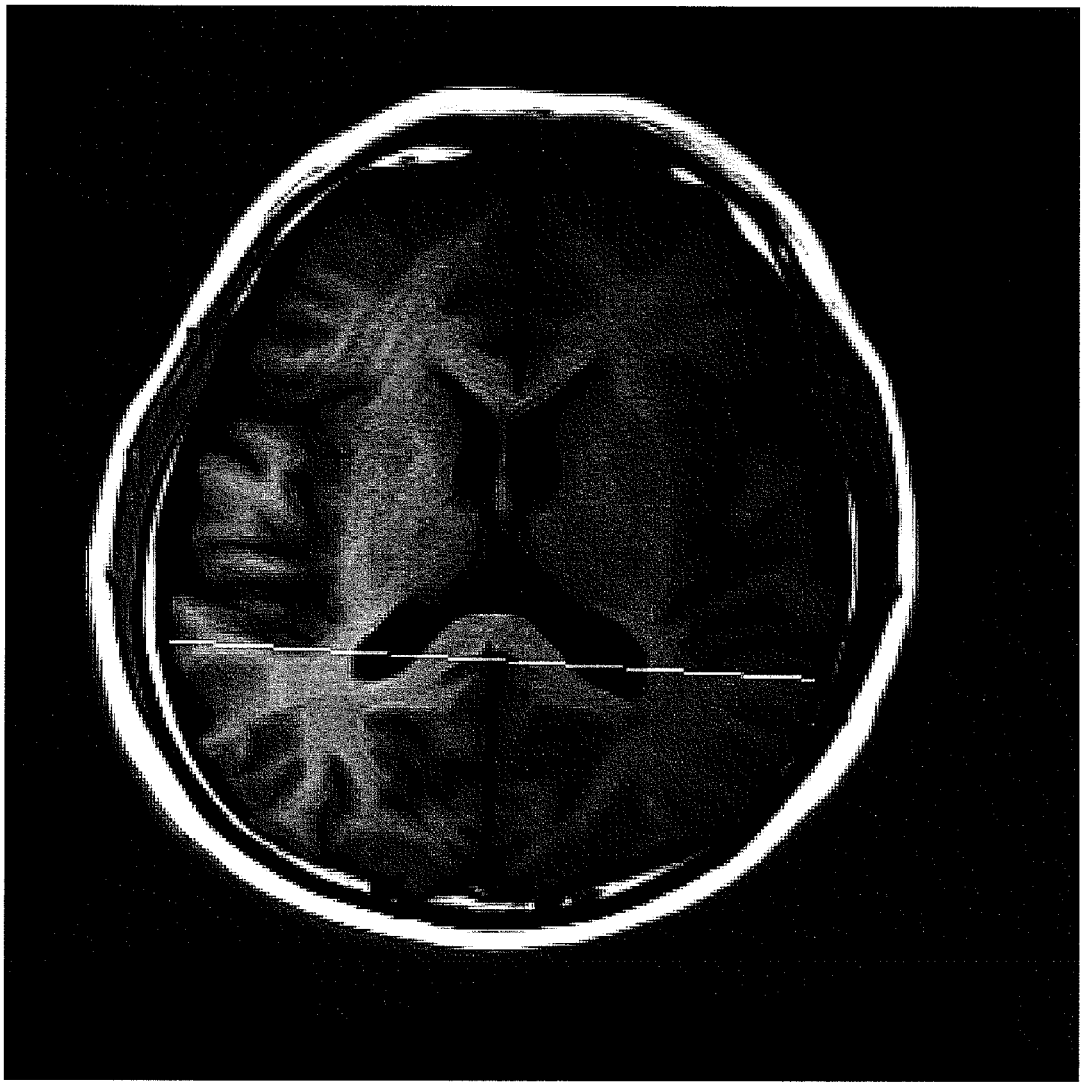
FIG. 2 is a diagram showing an image of which nonuniformity due to sensitivity unevenness does not corrected adequately in spite of the conventional sensitivity correction with using the WBC.
Figure 3:
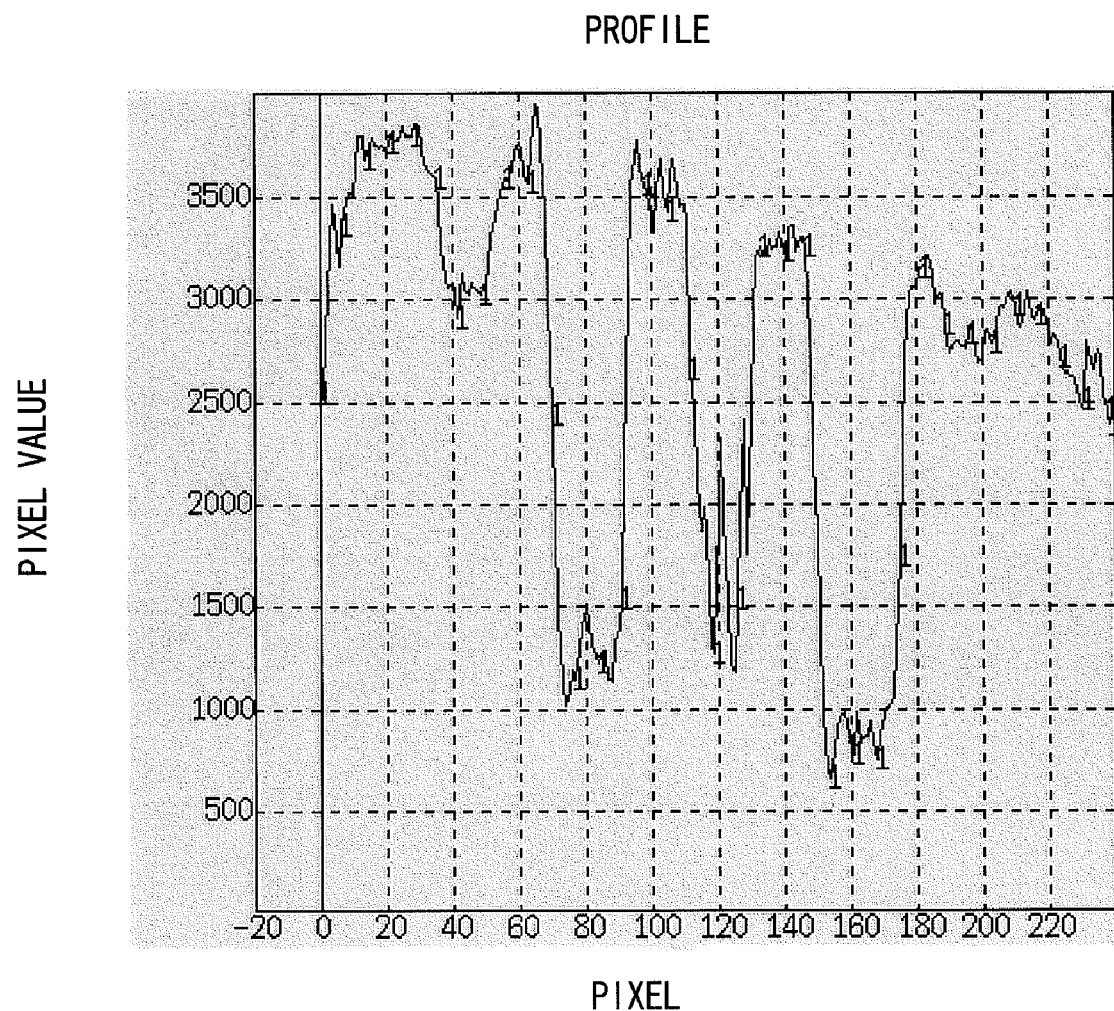
FIG. 3 is a diagram showing a profile of pixel values on respective pixel positions on a ROI which is represented with a line in an image, corrected under the conventional sensitivity correction method, shown in FIG. 2.
Figure 4:
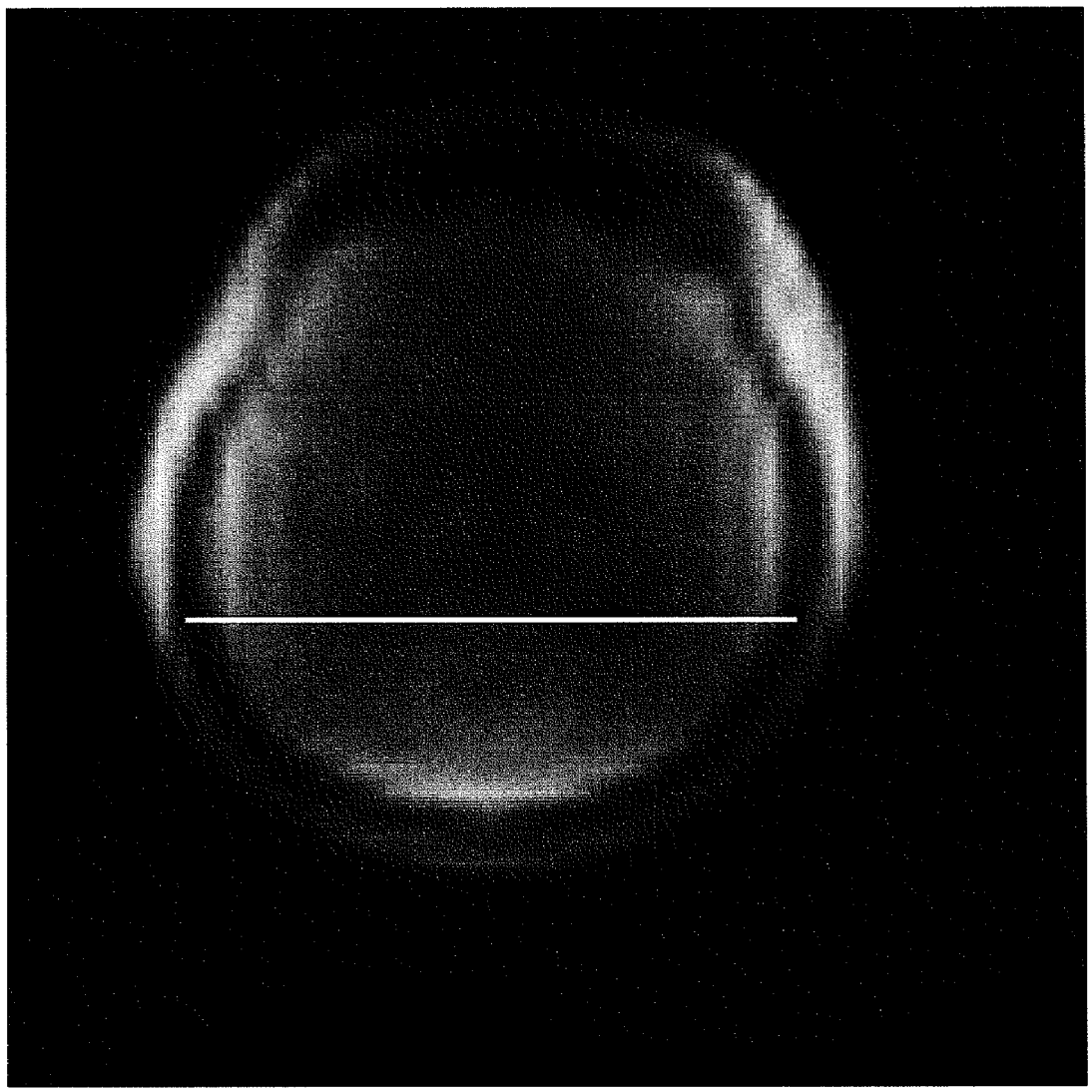
FIG. 4 shows conventional PAC image data acquired for generating sensitivity map data.
Figure 5:
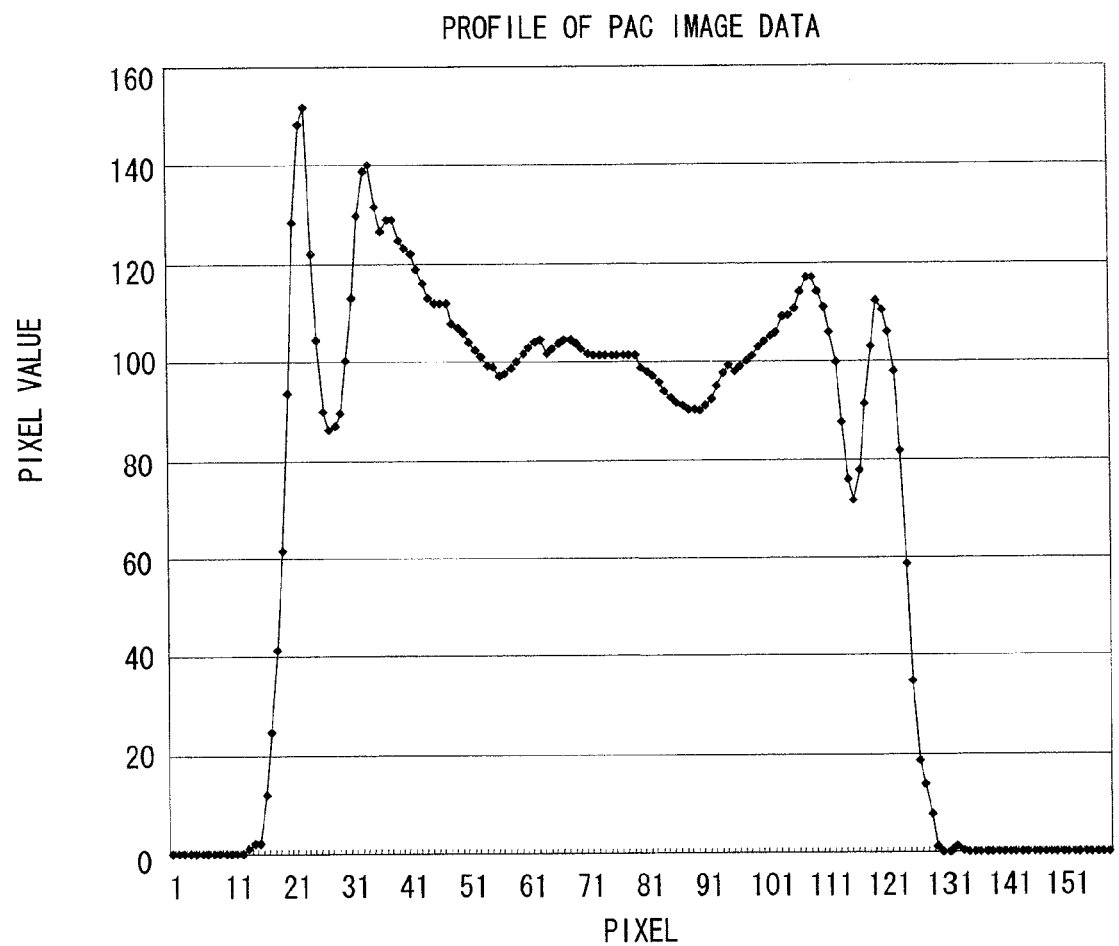
FIG. 5 is a diagram showing a profile of pixel values on respective pixel positions on a linear ROI in the conventional PAC image data for generating sensitivity map data shown in FIG. 4.
Figure 6:
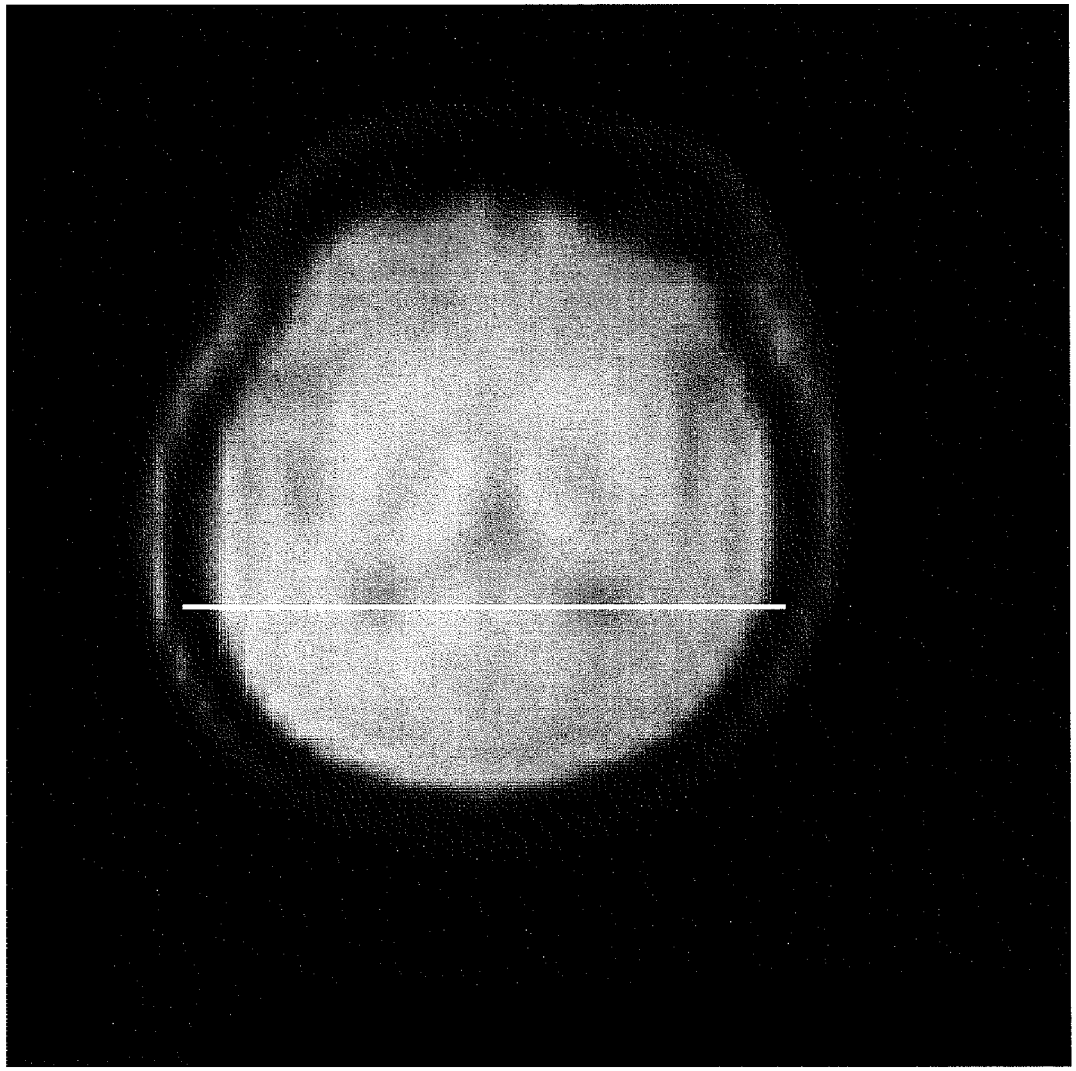
FIG. 6 shows conventional WBC image data acquired for generating sensitivity map data.
Figure 7:
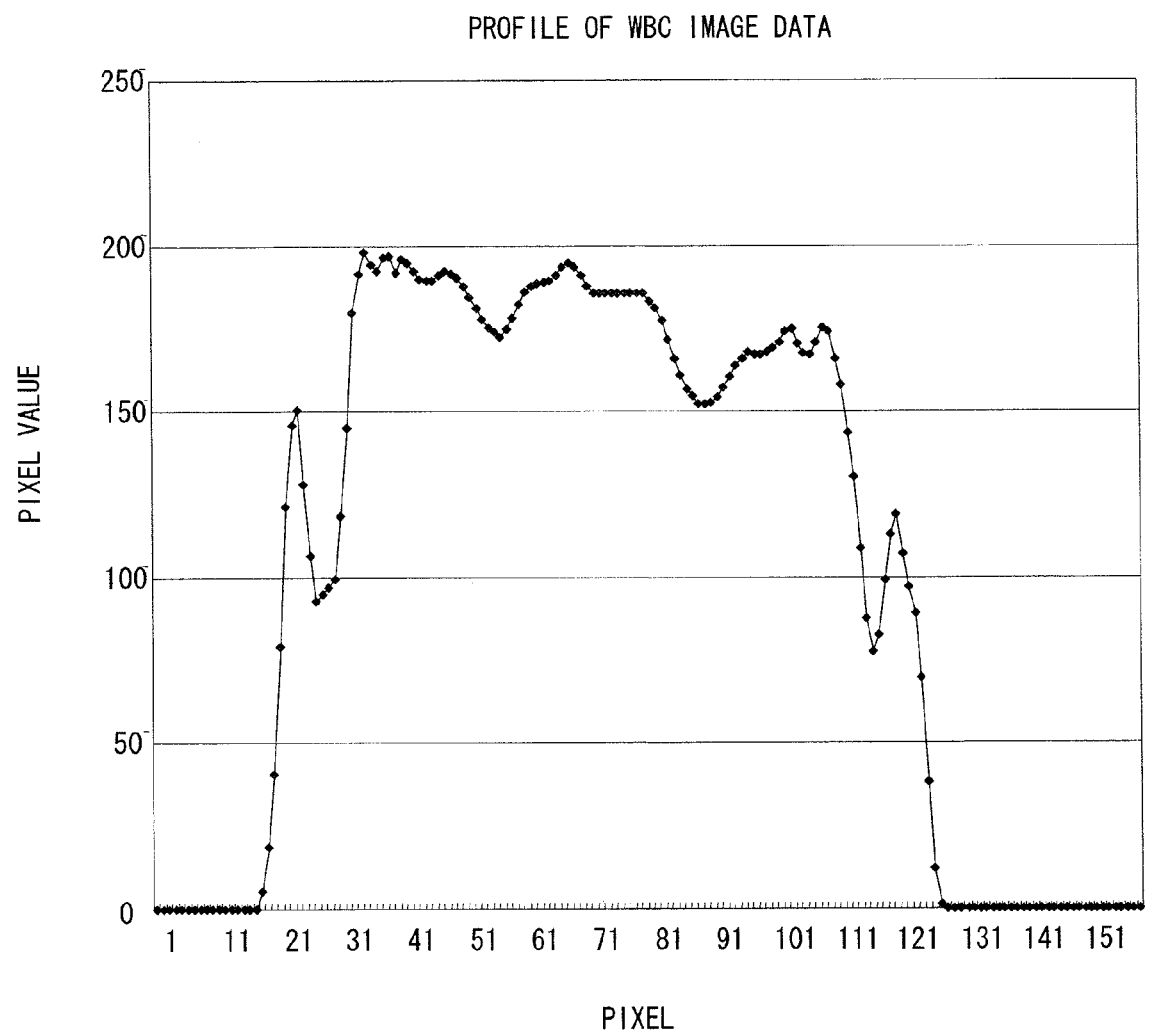
FIG. 7 is a diagram showing a profile of pixel values on respective pixel positions on a linear ROI in the conventional WBC image data for generating sensitivity map data shown in FIG. 6.

When sensitivity map data is obtained with using the flattened and corrected reference image data by the above-described contrast transformation and the sensitivity correction processing is performed on image data acquired by an imaging scan, a sensitivity difference (signal difference) between the right and left sides occurring in conventional image data as shown in FIG. 2 can be reduced considerably. This allows to acquire useful image data in clinical diagnosis.

That is, the magnetic resonance imaging apparatus 20 described above is an apparatus which performs a self correction of reference image data by itself for generating sensitivity map data for sensitivity correction of image data acquired by the phased array coil 24b having the plural coil elements 24c so that the reference image data becomes uniform in case of generating the sensitivity map data. Specifically, processing to flatten signal values in a main part of reference image data is performed as a self correction by performing spatial fitting processing, division or subtraction processing, and/or contrast transformation processing of the reference image data. These pieces of processing can be used in combination.

In other words, the magnetic resonance imaging apparatus 20 improves uniformity of reference image data by processing with software since there is a limit on the improvement of the uniformity of the reference image data with a hardware correspondence such as coupling.

(Effect)

Therefore, according to the magnetic resonance imaging apparatus 20, reference image data such as more uniform WBC image data with suppressed sensitivity irregularity can be generated. In addition, the accuracy of sensitivity correction is improved by using sensitivity map data generated from the reference image data generated more uniformly and the uniformity of image data can be improved eventually.

As a result, a high-accuracy correction of sensitivity irregularity that was formerly difficult can be performed robustly.

What is claimed is:

1. A magnetic resonance imaging apparatus comprising:
a sensitivity map data generating unit configured
to apply a first self correction processing for improving uniformity to non-uniform whole body coil data or non-uniform phased array coil data to generate reference image data, the non-uniform whole body coil data and the non-uniform phased array coil data being data acquired from an object using a whole body coil and a phased array coil, respectively, through a sensitivity map pre-scan,
to apply a second self correction processing for further improving uniformity to the generated reference image data, after the first self correction processing, to generate corrected reference image data, the first self correction processing being rougher than the second self correction processing,
to generate basic data for sensitivity map data using the corrected reference image data and the non-uniform phased array coil data, and
to generate the sensitivity map data of the phased array coil from the basic data for the sensitivity map data; and
a sensitivity corrected image data generating unit configured to acquire image data for imaging from the object with the phased array coil as a receive coil and to generate image data after sensitivity correction by performing the sensitivity correction of the image data using the sensitivity map data.

2. A magnetic resonance imaging apparatus of claim 1, wherein the non-unifoim whole body coil data and the non-uniform phased array coil data are low contrast data.

3. A magnetic resonance imaging apparatus of claim 1, wherein the second self correction processing includes a nonlinear contrast transformation of the reference image data.

4. A magnetic resonance imaging apparatus of claim 1, wherein the second self correction processing includes spatial fitting processing of the reference image data.

5. A magnetic resonance imaging apparatus of claim 1, wherein said sensitivity map data generating unit is configured to generate the reference image data based on data acquired with a whole body coil as a receive coil.

6. A magnetic resonance imaging apparatus of claim 1, wherein said sensitivity map data generating unit is configured to generate the reference image data based on the phased array coil data.

7. A magnetic resonance imaging method comprising:
applying a first self correction processing for improving uniformity to non-uniform whole body coil data or non-uniform phased array coil data to generate reference image data, the non-uniform whole body coil data and the non-uniform phased array coil data being data acquired from an object using a whole body coil and a phased array coil, respectively, through a sensitivity map pre-scan,
applying a second self correction processing for further improving uniformity to the generated reference image data, after the first self correction processing, to generate corrected reference image data, the first self correction processing being rougher than the second self correction processing,
generating basic data for sensitivity map data using the corrected reference image data and the non-uniform phased array coil data,
generating the sensitivity map data of the phased array coil from the basic data for the sensitivity map data; and
acquiring image data for imaging from the object with the phased array coil as a receive coil and generating image data after sensitivity correction by performing the sensitivity correction of the image data using the sensitivity map data.

* * * * *